(12) United States Patent
Nanataki et al.

(10) Patent No.: US 7,332,851 B2
(45) Date of Patent: Feb. 19, 2008

(54) PIEZOELECTRIC/ELECTROSTRICTIVE FILM TYPE DEVICE AND METHOD OF MANUFACTURING THE SAME

(75) Inventors: Tsutomu Nanataki, Toyoake (JP); Hirofumi Yamaguchi, Nagoya (JP); Toshikatsu Kashiwaya, Inazawa (JP); Takaaki Koizumi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/233,391

(22) Filed: Sep. 22, 2005

(65) Prior Publication Data

US 2006/0066176 A1  Mar. 30, 2006

Related U.S. Application Data

(60) Provisional application No. 60/614,354, filed on Sep. 29, 2004, provisional application No. 60/614,450, filed on Sep. 29, 2004, provisional application No. 60/659,484, filed on Mar. 8, 2005.

(51) Int. Cl.
*H01L 41/187* (2006.01)
(52) U.S. Cl. ..................................... 310/358
(58) Field of Classification Search ................. 310/358
See application file for complete search history.

(56) References Cited

U.S. PATENT DOCUMENTS

| 5,376,857 | A |   | 12/1994 | Takeuchi et al. |
| 5,625,202 | A | * | 4/1997 | Chai ......................... 257/94 |
| 5,853,514 | A |   | 12/1998 | Takeuchi et al. |
| 5,958,285 | A | * | 9/1999 | Kawano et al. ......... 252/62.9 R |
| 6,100,578 | A | * | 8/2000 | Suzuki ....................... 257/627 |
| 6,217,979 | B1 |   | 4/2001 | Takeuchi et al. |
| 6,503,416 | B2 |   | 1/2003 | Takeda et al. |
| 6,774,541 | B1 | * | 8/2004 | Fukui .......................... 310/358 |
| 6,884,364 | B2 |   | 4/2005 | Sato et al. |
| 2004/0032186 | A1 |   | 2/2004 | Murasato et al. |
| 2004/0058797 | A1 |   | 3/2004 | Nonoyama et al. |
| 2004/0176254 | A1 | * | 9/2004 | Ogawa et al. ............. 505/100 |
| 2005/0006618 | A1 |   | 1/2005 | Nanao et al. |
| 2005/0096230 | A1 | * | 5/2005 | Iwashita et al. ............. 505/190 |

FOREIGN PATENT DOCUMENTS

| EP | 1 283 553 A2 | 2/2003 |
| JP | 44-17103 | 7/1969 |
| JP | 45-8145 | 3/1970 |
| JP | 6-260694 | 9/1994 |
| JP | 9-92896 | 4/1997 |

(Continued)

*Primary Examiner*—Darren Schuberg
*Assistant Examiner*—Derek Rosenau
(74) *Attorney, Agent, or Firm*—Burr & Brown

(57) ABSTRACT

A piezoelectric/electrostrictive film device is provided including a thin ceramic substrate and a piezoelectric/electrostrictive operating portion disposed on the substrate. The piezoelectric/electrostrictive operating portion includes a lower electrode film, a piezoelectric/electrostrictive film including a large number of crystal particles having a piezoelectric/electrostrictive composition, and an upper electrode film successively laminated on the substrate. The piezoelectric/electrostrictive composition excludes lead and contains one or more alkali metal elements selected from the group consisting of lithium, potassium, and sodium, and one or more metal elements selected from the group consisting of niobium, tantalum, antimony, and silver. Circle equivalent diameters of at least 90% of the crystal particles in the piezoelectric/electrostrictive film are in a range of 0.3 to 50 μm.

30 Claims, 6 Drawing Sheets

FOREIGN PATENT DOCUMENTS

| | | |
|---|---|---|
| JP | 2002-068835 | 3/2002 |
| JP | 2002-068836 | 3/2002 |
| JP | 2002-321975 | 11/2002 |
| JP | 2003-008096 | 1/2003 |
| JP | 2003-046154 | 2/2003 |
| JP | 2003-221276 | 8/2003 |
| JP | 2003-277145 | 10/2003 |
| JP | 2004-064067 | 2/2004 |
| JP | 2004-115293 | 4/2004 |
| JP | 2004-244299 | 9/2004 |
| JP | 2004-323325 | 11/2004 |

* cited by examiner

PIEZOELECTRIC/ELECTROSTRICTIVE FILM TYPE DEVICE AND METHOD OF MANUFACTURING THE SAME

CROSS REFERENCE TO RELATED APPLICATIONS

This application claims the benefit under 35 USC §119(e) of U.S. Provisional Application Ser. No. 60/614,354, filed Sep. 29, 2004, U.S. Provisional Application Ser. No. 60/614,450, filed Sep. 29, 2004 and U.S. Provisional Application Ser. No. 60/659,484, filed Mar. 8, 2005, the entireties of which are incorporated herein by reference.

BACKGROUND OF THE INVENTION

1. Field of the Invention

The present invention relates to a piezoelectric/electrostrictive film type device, and a method of manufacturing the device, and more particularly to a piezoelectric/electrostrictive film type device which exhibits superior piezoelectric/electrostrictive characteristics and in which considerations are given to even environments, and a method of manufacturing the device.

2. Description of the Related Art

Heretofore, piezoelectric/electrostrictive devices have been known to be capable of controlling micro-displacement of the order of sub-microns. Especially, a piezoelectric/electrostrictive film type device is preferable for the control of the micro displacement. In the film type device, a piezoelectric/electrostrictive portion constituted of a piezoelectric/electrostrictive composition and an electrode portion to which a voltage is applied are laminated on a substrate made of a ceramic. Additionally, the film type device has superior characteristics such as a high electromechanical conversion efficiency, a high-speed response, a high durability, and a saved power consumption. The piezoelectric/electrostrictive device is used in various applications such as a piezoelectric pressure sensor, a probe moving mechanism of a scanning type tunnel microscope, a rectilinear guide mechanism in an ultra-precise working device, a servo valve for hydraulic control, a head of a VTR device, a pixel constituting a flat panel type image display device, and a head of an ink jet printer Moreover, the piezoelectric/electrostrictive composition constituting the piezoelectric/electrostrictive portion has also been variously investigated. For example, there has been disclosed a $Pb(Mg_{1/3}Nb_{2/3})O_3$—$PbZrO_3$—$PbTiO_3$ three-component dissolved composition (PZT-based composition), or a piezoelectric/electrostrictive composition in which a part of Pb in the PZT-based composition is replaced with Sr, La or the like (see, e.g., Patent Documents 1 and 2). As to the piezoelectric/electrostrictive portion itself, which is the most important portion that determines the piezoelectric/electrostrictive characteristics of the piezoelectric/electrostrictive device, there is expected to be obtained the piezoelectric/electrostrictive device having a superior piezoelectric/electrostrictive characteristic (e.g., piezoelectric d constant).

Additionally, the PZT-based composition unavoidably contains lead (Pb). Especially, in recent years, an influence on global environments, such as elution of lead (Pb) due to acid rain, has tended to be regarded as a problem. Therefore, as a piezoelectric/electrostrictive material in which the influence on the environments is considered, there is disclosed a piezoelectric porcelain (or a piezoelectric composition) capable of providing a piezoelectric article or a piezoelectric device which exhibits the satisfactory piezoelectric/electrostrictive characteristic although lead (Pb) is not contained (see, e.g., Patent Documents 3 to 6).

However, as to the piezoelectric article or the like obtained using the piezoelectric porcelain (or the piezoelectric composition) disclosed in Patent Documents 3 to 6, a large displacement is not easily obtained as compared with the piezoelectric article obtained using the PZT-based composition containing lead (Pb). In respect of superiority/inferiority of the piezoelectric/electrostrictive characteristic, it cannot be said that the PZT-based composition is superior in the present situation. Therefore, there has been a necessity for developing a device exhibiting superior piezoelectric/electrostrictive characteristics even in a case where lead (Pb) is not contained.

[Patent Document 1] Japanese Patent Publication No. 44-17106

[Patent Document 2] Japanese Patent Publication No. 45-8145

[Patent Document 3] Japanese Patent Application Laid-Open No. 2003-221276

[Patent Document 4] Japanese Patent Application Laid-Open No. 2003-277145

[Patent Document 5] Japanese Patent Application Laid-Open No. 2002-68836

[Patent Document 6] Japanese Patent Application Laid-Open No. 2004-244299

SUMMARY OF THE INVENTION

The present invention has been developed in view of such conventional technical problems, and an object thereof is to provide a piezoelectric/electrostrictive film type device which exhibits a superior piezoelectric/electrostrictive characteristic without containing lead (Pb) and which can obtain an especially large displacement, and a method of manufacturing the device.

As a result of intensive investigation by the present inventors in order to achieve the above object, it has been found that the above-described object can be achieved when a piezoelectric/electrostrictive film is constituted of crystal particles made of a piezoelectric/electrostrictive composition containing a predetermined alkali metal element and a metal element, and the piezoelectric/electrostrictive film is formed into a homogeneous film, and the present invention has been completed. It has also been found that the above-described object can be achieved, when the piezoelectric/electrostrictive film is constituted of crystal particles made of a piezoelectric/electrostrictive composition containing a predetermined alkali metal element and a metal element, and oxides of the alkali metal element and the metal element are contained in a substrate, and the present invention has been completed.

That is, according to the present invention, the following piezoelectric/electrostrictive film type devices and method of manufacturing the devices are provided.

According to a first embodiment of the present invention, a piezoelectric/electrostrictive film type device (hereinafter referred to also as "the first piezoelectric/electrostrictive film type device") is provided, comprising a thin substrate made of a ceramic and a piezoelectric/electrostrictive operating portion disposed on the substrate. The piezoelectric/electrostrictive operating portion is constituted by successively laminating a lower electrode film, a piezoelectric/electrostrictive film containing a large number of crystal particles constituted of a piezoelectric/electrostrictive composition, and an upper electrode film. The piezoelectric/electrostrictive composition contains one or more alkali metal elements selected from the group consisting of lithium (Li), potassium (K), and sodium (Na), and one or more metal elements selected from the group consisting of niobium (Nb), tantalum (Ta), antimony (Sb), and silver (Ag) (however, surely containing niobium (Nb) mentioned above), and circle equivalent diameters of 90% or more of the large number of crystal particles are in a range of 0.3 to 50 μm.

According to a second aspect of the first embodiment of present invention, the first piezoelectric/electrostrictive film type device is provided, wherein the piezoelectric/electrostrictive composition is represented by the following general formula (1), and the substrate is fired integrally with the piezoelectric/electrostrictive operating portion:

$$(Na_{1-x-y-z}K_xLi_yAg_z)_a(Nb_{1-w}Ta_w)O_3 \quad (1);$$

wherein $0.1 \leq x \leq 0.9$, $0 \leq y \leq 0.2$, $0 \leq z \leq 0.05$, $0 \leq w \leq 0.5$, and $0.95 \leq a \leq 1.05$.

According to a third aspect of the first embodiment of the present invention, the first piezoelectric/electrostrictive film type device is provided, wherein the piezoelectric/electrostrictive composition is represented by the following general formula (2), and the substrate is fired integrally with the piezoelectric/electrostrictive operating portion:

$$(Ag_{1-x}Li_x)_a(Nb_{1-y}Ta_y)O_3 \quad (2);$$

wherein $0.075 \leq x \leq 0.4$, $0 \leq y \leq 0.2$, and $0.95 \leq a \leq 1.05$.

According to a fourth aspect of the first embodiment of the present invention, the first piezoelectric/electrostrictive film type device is provided, wherein the piezoelectric/electrostrictive composition is represented by the following general formula (3), and the substrate is fired integrally with the piezoelectric/electrostrictive operating portion:

$$\{Li_x(K_{1-y}Na_y)_{1-x}\}_a(Nb_{1-z-w}Ta_zSb_w)O_3 \quad (3);$$

wherein $0 \leq x \leq 0.2$, $0 \leq y \leq 1$, $0 \leq z \leq 0.4$, $0 \leq w \leq 0.2$, and $0.95 \leq a \leq 1.05$.

According to a fifth aspect of the first embodiment of the present invention, a piezoelectric/electrostrictive film type device according to any one of the above aspects is provided, wherein the alkali metal element and/or the metal element contained in the piezoelectric/electrostrictive composition is contained in the substrate.

According to a sixth aspect of the first embodiment of the present invention, a piezoelectric/electrostrictive film type device according to the fifth aspect is provided, wherein the alkali metal element and/or the metal element is contained in the form of an oxide thereof in the substrate.

According to a seventh aspect of the first embodiment of the present invention, a piezoelectric/electrostrictive film type device according to the sixth aspect is provided, wherein a concentration of each of the oxide of the alkali metal element and/or the oxide of the metal element contained in the substrate radically and gradually drops along a thickness direction of the substrate from a central portion of an interface between the substrate and the lower electrode film.

According to an eighth aspect of the first embodiment of the present invention, a piezoelectric/electrostrictive film type device according to the seventh aspect is provided, wherein when the concentration of each of the oxide of the alkali metal element and the oxide of the metal element contained in the vicinity of the central portion of the interface is X, a portion in which the concentration of each of the oxide of the alkali metal element and the oxide of the metal element contained in the substrate is 0.3X is a portion corresponding to a distance of 10 to 90% of a thickness of the substrate from the central portion of the interface.

According to a ninth aspect of the first embodiment of the present invention, a piezoelectric/electrostrictive film type device according to any of the above sixth through eighth aspects is provided, wherein the oxide of the alkali metal element and/or the oxide of the metal element is contained in the particles made of the ceramic constituting the substrate.

According to a tenth aspect of the first embodiment of the present invention, a piezoelectric/electrostrictive film type device according to any of the above aspects is provided, wherein the piezoelectric/electrostrictive film has such a size that the piezoelectric/electrostrictive film covers the lower electrode film and the end portions thereof are extended over the substrate, and the end portions of the piezoelectric/electrostrictive film protruding onto the substrate, and portions of the substrate corresponding to the end portions constitute an incompletely bonded state.

According to an eleventh aspect of the first embodiment of the present invention, a piezoelectric/electrostrictive film type device according to any of the above first through ninth aspects is provided, wherein the piezoelectric/electrostrictive film has such a size that the piezoelectric/electrostrictive film covers the lower electrode film and the end portions thereof are extended over the substrate, and the end portions of the piezoelectric/electrostrictive film protruding onto the substrate, and portions of the substrate corresponding to the end portions constitute a detached state at a predetermined interval.

According to a twelfth aspect of the first embodiment of the present invention, a piezoelectric/electrostrictive film type device according to the tenth or eleventh aspects is provided, wherein the concentration of each of the alkali metal element and the metal element is higher in the portions corresponding to the end portions than in the vicinity of the interface.

According to a thirteenth aspect of the first embodiment of the present invention, a piezoelectric/electrostrictive film type device according to any of the tenth through twelfth aspects is provided, wherein the substrate contains alumina ($Al_2O_3$), and a reaction product of the alkali metal element and the alumina ($Al_2O_3$) is unevenly distributed in a layer state in a portion of the substrate including the portions of the substrate corresponding to the end portions and the interface between the substrate and the lower electrode film.

According to a fourteenth aspect of the first embodiment of the present invention, a piezoelectric/electrostrictive film type device according to any of the above aspects is provided, wherein the piezoelectric/electrostrictive film is formed by firing after the lower electrode film is formed on the substrate.

According to a fifteenth aspect of the first embodiment of the present invention, a piezoelectric/electrostrictive film type device according to any of the above aspects is provided, wherein the lower electrode film is formed by firing.

According to a sixteenth aspect of the first embodiment of the present invention, a piezoelectric/electrostrictive film type device according to any of the above aspects is provided, wherein a constituting material of the lower electrode film is platinum (Pt).

According to a seventeenth aspect of the first embodiment of the present invention, a piezoelectric/electrostrictive film type device according to any of the above aspects is provided, wherein the ceramic constituting the substrate contains 0.01 mass % or more of aluminum (Al).

According to a second embodiment of the present invention, a piezoelectric/electrostrictive film type device (hereinafter referred to also as "the second piezoelectric/electrostrictive film type device") is provided, comprising a thin substrate made of a ceramic and a piezoelectric/electrostrictive operating portion disposed on the substrate. The piezoelectric/electrostrictive operating portion is constituted by successively laminating a lower electrode film, a piezoelectric/electrostrictive film containing a large number of crystal particles constituted of a piezoelectric/electrostrictive composition, and an upper electrode film. The piezoelectric/electrostrictive composition contains one or more alkali metal elements selected from the group consisting of lithium (Li), potassium (K), and sodium (Na), and one or more metal elements selected from the group consisting of niobium (Nb), tantalum (Ta), antimony (Sb), and silver (Ag) (however, surely containing niobium (Nb) mentioned above), and the alkali metal element and/or the metal element contained in the piezoelectric/electrostrictive composition is contained in the substrate.

According to a second aspect of the second embodiment of the present invention, the second piezoelectric/electrostrictive film type device is provided, wherein the piezoelectric/electrostrictive composition is represented by the following general formula (1), and the substrate is fired integrally with the piezoelectric/electrostrictive operating portion:

$$(Na_{1-x-y-z}K_xLi_yAg_z)_a(Nb_{1-w}Ta_w)O_3 \quad (1);$$

wherein $0.1 \leq x \leq 0.9$, $0 \leq y \leq 0.2$, $0 \leq z \leq 0.05$, $0 \leq w \leq 0.5$, and $0.95 \leq a \leq 1.05$.

According to a third aspect of the second embodiment of the present invention, the second piezoelectric/electrostrictive film type device is provided, wherein the piezoelectric/electrostrictive composition is represented by the following general formula (2), and the substrate is fired integrally with the piezoelectric/electrostrictive operating portion:

$$(Ag_{1-x}Li_x)_a(Nb_{1-y}Ta_y)O_3 \quad (2);$$

wherein $0.075 \leq x \leq 0.4$, $0 \leq y \leq 0.2$, and $0.95 \leq a \leq 1.05$.

According to a fourth aspect of the second embodiment of the present invention, the second piezoelectric/electrostrictive film type device is provided, wherein the piezoelectric/electrostrictive composition is represented by the following general formula (3), and the substrate is fired integrally with the piezoelectric/electrostrictive operating portion:

$$\{Li_x(K_{1-y}Na_y)_{1-x}\}_a(Nb_{1-z-w}Ta_zSb_w)O_3 \quad (3);$$

wherein $0 \leq x \leq 0.2$, $0 \leq y \leq 1$, $0 \leq z \leq 0.4$, $0 \leq w \leq 0.2$, and $0.95 \leq a \leq 1.05$.

According to a fifth aspect of the second embodiment of the present invention, the piezoelectric/electrostrictive film type device according to any of the above first through fourth aspects is provided, wherein the alkali metal element and/or the metal element is contained in the form of an oxide thereof in the substrate.

According to a sixth aspect of the second embodiment of the present invention, the piezoelectric/electrostrictive film type device according to the fifth aspect is provided, wherein a concentration of each of the oxide of the alkali metal element and/or the oxide of the metal element contained in the substrate radically and gradually drops along a thickness direction of the substrate from a central portion of an interface between the substrate and the lower electrode film.

According to a seventh aspect of the second embodiment of the present invention, the piezoelectric/electrostrictive film type device according to the sixth aspect is provided, when the concentration of each of the oxide of the alkali metal element and the oxide of the metal element contained in the vicinity of the central portion of the interface is X, a portion in which the concentration of each of the oxide of the alkali metal element and the oxide of the metal element contained in the substrate is 0.3X is a portion corresponding to a distance of 10 to 90% of a thickness of the substrate from the central portion of the interface.

According to an eighth aspect of the second embodiment of the present invention, the piezoelectric/electrostrictive film type device according to any of the fifth through seventh aspects is provided, the oxide of the alkali metal element and/or the oxide of the metal element is contained in the particles made of the ceramic constituting the substrate.

According to a ninth aspect of the second embodiment of the present invention, the piezoelectric/electrostrictive film type device according to any of the above first through eighth aspects is provided, wherein the piezoelectric/electrostrictive film has such a size that the piezoelectric/electrostrictive film covers the lower electrode film and the end portions thereof are extended over the substrate, and the end portions of the piezoelectric/electrostrictive film protruding onto the substrate, and portions of the substrate corresponding to the end portions constitute an incompletely bonded state.

According to a tenth aspect of the second embodiment of the present invention, the piezoelectric/electrostrictive film type device according to any of the first through eighth aspects is provided, wherein the piezoelectric/electrostrictive film has such a size that the piezoelectric/electrostrictive film covers the lower electrode film and the end portions thereof are extended over the substrate, and the end portions of the piezoelectric/electrostrictive film being extended over the substrate and portions of the substrate corresponding to the end portions constitute a detached state at a predetermined interval.

According to an eleventh aspect of the second embodiment of the present invention, the piezoelectric/electrostrictive film type device according to the ninth or tenth aspects is provided, wherein the concentration of each of the oxide of the alkali metal element and the oxide of the metal element is higher in the portions corresponding to the end portions than in the vicinity of the interface.

According to a twelfth aspect of the second embodiment of the present invention, the piezoelectric/electrostrictive film type device according to any of the ninth through eleventh aspects is provided, wherein the substrate contains alumina ($Al_2O_3$), and a reaction product of the alkali metal element and the alumina ($Al_2O_3$) is unevenly distributed in a layer state in a portion of the substrate including the portions of the substrate corresponding to the end portions and the interface between the substrate and the lower electrode film.

According to a thirteenth aspect of the second embodiment of the present invention, the piezoelectric/electrostrictive film type device according to any of the first through twelfth aspects is provided, wherein the piezoelectric/electrostrictive film is formed by firing after the lower electrode film is formed on the substrate.

According to a fourteenth aspect of the second embodiment of the present invention, the piezoelectric/electrostrictive film type device according to any of the above aspects is provided, wherein the lower electrode film is formed by firing.

According to a fifteenth aspect of the second embodiment of the present invention, the piezoelectric/electrostrictive film type device according to any of the above aspects is provided, wherein a constituting material of the lower electrode film is platinum (Pt).

According to a sixteenth aspect of the second embodiment of the present invention, the piezoelectric/electrostrictive film type device according to any of the above aspects is provided, wherein the ceramic constituting the substrate contains 0.01 mass % or more of aluminum (Al).

According to a third embodiment of the present invention, a method of manufacturing a piezoelectric/electrostrictive film type device is provided. The piezoelectric/electrostrictive film type devices comprises a thin substrate made of a ceramic, and a piezoelectric/electrostrictive operating portion disposed on the substrate. The piezoelectric/electrostrictive operating portion is constituted by successively laminating a lower electrode film, a piezoelectric/electrostrictive film containing a large number of crystal particles constituted of a piezoelectric/electrostrictive composition, and an upper electrode film. The method comprises the steps of disposing and firing a piezoelectric/electrostrictive composition which satisfies the following conditions (1) as a layer on the lower electrode film to thereby form the piezoelectric/electrostrictive films wherein the conditions (1) include that the piezoelectric/electrostrictive composition is prepared using one or more of a plurality of material compounds each containing one or more alkali metal elements selected from the group consisting of lithium (Li), potassium (K), and sodium (Na) and one or more metal elements selected from the group consisting of niobium (Nb), tantalum (Ta), antimony (Sb), and silver (Ag) among contained constituting elements, wherein the material compound is provided in a larger amount than a theoretical necessary amount of that material compound calculated from a general formula representing the piezoelectric/electrostrictive composition constituting the crystal particles contained in the piezoelectric/electrostrictive film to be formed.

According to the above method for manufacturing the piezoelectric/electrostrictive film type device, the material compound is used by 0.1 to 25 mass % more of the alkali metal element and the metal element contained in each compound is used compared with the respective theoretical necessary amounts.

In the first and second piezoelectric/electrostrictive film type devices according to the present invention, lead (Pb) is not contained, and considerations are highly given to environments. The first and second piezoelectric/electrostrictive film type devices of the present invention produce an effect that the displacement generated in the piezoelectric/electrostrictive operating portion is remarkably effectively transmitted to the substrate, superior piezoelectric/electrostrictive characteristics are exhibited although lead (Pb) is not contained, and especially large displacements can be obtained.

Moreover, in the method of manufacturing the piezoelectric/electrostrictive film type device according to the present invention, the piezoelectric/electrostrictive film type device in which lead (Pb) is not contained can be easily manufactured, and considerations are highly given to the environments, and superior piezoelectric/electrostrictive characteristics are exhibited.

Figure 1:
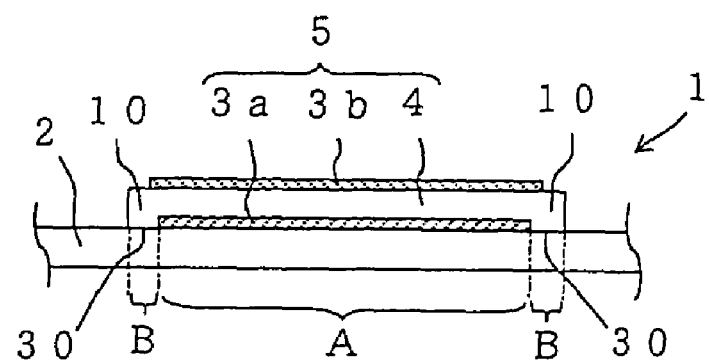
FIG. 1 is a partial sectional view schematically showing one embodiment of a piezoelectric/electrostrictive film type device according to the present invention.

DESCRIPTION OF REFERENCE NUMERALS USED HEREIN 1, 51: piezoelectric/electrostrictive film type device;
2, 12, 22: substrate;
3a, 13a, 23a: lower electrode film;
3b, 13b, 23b: upper electrode film;
23c: inner electrode film;
4, 14: piezoelectric/electrostrictive film;
24a: first piezoelectric/electrostrictive film;
24b: second piezoelectric/electrostrictive film;
5, 15, 32, 35: piezoelectric/electrostrictive operating portion;
10, 60: protruding end portion;
20: detaching space;
30: incompletely bonded portion;
31: arm portion;
40: ceramic article;
50a: lower electrode terminal;
50b: upper electrode terminal;
50c: inner electrode terminal;
65: central portion of interface between substrate and lower electrode film;
68: vicinity portion of central portion of interface;
70: insulating layer;
80: cavity;
81: hole portion;
82: bonded surface;
83: thin portion;
84: thick portion;
A: lower electrode abutting portion; and
B: portion corresponding to protruding end portion.

DETAILED DESCRIPTION OF THE INVENTION

A preferred mode for carrying out the present invention will be described hereinafter, but it should be understood that, the present invention is not limited to the following embodiments, and the present invention includes appropriate alterations, modifications and the like added to the following embodiments based on ordinary knowledge of a person skilled in the art without departing from the scope of the present invention. It is to be noted that when a "piezoelectric/electrostrictive film type device of the present invention (the present embodiment)" is simply referred to in the present specification, either the first piezoelectric/electrostrictive film type device or the second piezoelectric/electrostrictive film type device is meant.

FIG. 1 is a partial sectional view schematically showing one embodiment of a piezoelectric/electrostrictive film type device of the present invention. The piezoelectric/electrostrictive film type device 1 of the present embodiment includes a thin substrate 2 made of a ceramic and a piezoelectric/electrostrictive operating portion 5 disposed on this substrate 2. The piezoelectric/electrostrictive operating portion 5 is constituted by successively laminating a lower electrode film 3a, a piezoelectric/electrostrictive film 4 containing a large number of crystal particles constituted of a piezoelectric/electrostrictive composition, and an upper electrode film 3b. In the piezoelectric/electrostrictive film type device 1 of the present embodiment, the piezoelectric/electrostrictive composition constituting the large number of crystal particles contained in the piezoelectric/electrostrictive film 4 contains one or more alkali metal elements selected from the group consisting of lithium (Li), potassium (K), and sodium (Na), and one or more metal elements selected from the group consisting of niobium (Nb), tantalum (Ta), antimony (Sb), and silver (Ag). However, niobium (Nb) is surely contained.

Thus, the piezoelectric/electrostrictive film 4 having the piezoelectric/electrostrictive composition containing the above-described alkali metal element and metal element has a denser microstructure compared with the piezoelectric/electrostrictive film having a piezoelectric/electrostrictive composition which does not contain any of these metal elements. Therefore, the piezoelectric/electrostrictive film type device 1 of the present embodiment exhibits superior piezoelectric/electrostrictive characteristics, and especially large displacements can be obtained.

In the first piezoelectric/electrostrictive film type device 1 of the present embodiment, the circle equivalent diameters of 90% or more of the crystal particles among the large number of crystal particles contained in the piezoelectric/electrostrictive film 4 are in a range of 0.3 to 50 µm, preferably 1 to 15 µm, more preferably 2 to 5 µm. When the circle equivalent diameters of 90% or more of crystal particles among the large number of crystal particles contained in the piezoelectric/electrostrictive film 4 are in a range of 0.3 to 50 µm, the piezoelectric/electrostrictive film 4 is a comparatively homogeneous film. Therefore, piezoelectric/electrostrictive effects present in the piezoelectric/electrostrictive composition constituting the crystal particles are sufficiently exerted, and the reliability of the piezoelectric/electrostrictive film 4 is also enhanced. When the diameter is less than 0.3 µm, piezoelectric/electrostrictive effects are not sufficiently exerted. On the other hand, when the diameter exceeds 50 µm, the insulating property or bending strength of the piezoelectric/electrostrictive film decreases, and the reliability of the piezoelectric/electrostrictive film type device deteriorates. It is to be noted that the "circle equivalent diameters of the crystal particles" mentioned in the present specification refers to the diameter of a circle having an area equal to an occupying area of a section of each crystal particle having a polygonal shape or a roundish shape observed in an arbitrary section of the piezoelectric/electrostrictive film. The circle equivalent diameters of all (i.e., 100%) of the large number of crystal particles are especially preferably in the above-described numerical value range. It is to be noted that when particle diameters or firing conditions (firing temperature, retaining time, temperature rise speed, etc.) of the piezoelectric/electrostrictive composition are appropriately adjusted and selected, 90% or more of crystal particles can have circle equivalent diameters set in a predetermined numerical value range.

Moreover, in the piezoelectric/electrostrictive film type device 1 of the present embodiment, the substrate 2 contains the above-described alkali metal element (Li, K, and Na), and the above-described metal element (Nb, Ta, and Sb) contained in the piezoelectric/electrostrictive composition. It is to be noted that the alkali metal element or the metal element may be contained in the substrate 2 in any state, but typically it is preferably contained as an oxide thereof in the substrate 2. The substrate 2 containing the oxide of the alkali metal element has a higher flexibility, more easily follows the displacement generated in the piezoelectric/electrostrictive operating portion 5, and can obtain much larger displacements compared with a usual ceramic-made substrate which does not contain any oxide of the alkali metal element.

Moreover, according to the present embodiment, the second piezoelectric/electrostrictive film type device 1 provided with the substrate 2 containing the above-described oxide of the metal element can obtain displacements which are larger than that of the usual piezoelectric/electrostrictive film type device provided with a ceramic-made substrate that does not contain any oxides of the metal element. Since niobium (Nb), tantalum (Ta), and antimony (Sb) are elements having small ion radiuses, it is considered that they are easily diffused inside the substrate 2 at a high temperature. It is presumed that these elements diffused inside the substrate 2 relax internal stresses accumulated inside the substrate 2, and displacement resistances based on the internal stresses can be reduced.

It is to be noted that in the piezoelectric/electrostrictive film type device 1 of the present embodiment in which (1) the circle equivalent diameters of 90% or more of crystal particles among the crystal particles contained in the piezoelectric/electrostrictive film 4 are 0.3 to 50 µm (i.e., the piezoelectric/electrostrictive film 4 is homogeneous) and (2) the alkali metal element or the metal element contained in the piezoelectric/electrostrictive composition is contained in the substrate 2, the piezoelectric/electrostrictive effect originally present in the piezoelectric/electrostrictive composition are sufficiently developed. Therefore, in the piezoelectric/electrostrictive film type device of the present embodiment which simultaneously satisfies the above requirements (1) and (2), the effects based on the respective requirements are synergistically exerted, and superior flexural displacement can be obtained.

In the piezoelectric/electrostrictive film type device 1 of the present embodiment, the piezoelectric/electrostrictive composition constituting the piezoelectric/electrostrictive film 4 is represented by the following general formula (1), and the substrate 2 is preferably fired integrally with the piezoelectric/electrostrictive operating portion 5:

$$(Na_{1-x-y-z}K_xLi_yAg_z)_a(Nb_{1-w}Ta_w)O_3 \quad (1);$$

wherein $0.1 \leqq x \leqq 0.9$, $0 \leqq y \leqq 0.2$, $0 \leqq z \leqq 0.05$, $0 \leqq w \leqq 0.5$, and $0.95 \leqq a \leqq 1.05$.

On the other hand, in the piezoelectric/electrostrictive film type device 1 of the present embodiment, the piezoelectric/electrostrictive composition constituting the piezoelectric/electrostrictive film 4 is represented by the following general formula (2), and the substrate 2 is preferably fired integrally with the piezoelectric/electrostrictive operating portion 5:

$$(Ag_{1-x}Li_x)_a(Nb_{1-y}Ta_y)O_3 \quad (2);$$

wherein $0.075 \leqq x \leqq 0.4$, $0 \leqq y \leqq 0.2$, and $0.95 \leqq a \leqq 1.05$.

Moreover, in the piezoelectric/electrostrictive film type device 1 of the present embodiment, the piezoelectric/electrostrictive composition constituting the piezoelectric/electrostrictive film 4 is represented by the following general formula (3), and the substrate 2 is preferably fired integrally with the piezoelectric/electrostrictive operating portion 5:

$$\{Li_x(K_{1-y}Na_y)_{1-x}\}_a(Nb_{1-z-w}Ta_zSb_w)O_3 \quad (3);$$

wherein $0 \leqq x \leqq 0.2$, $0 \leqq y \leqq 1$, $0 \leqq z \leqq 0.4$, $0 \leqq w \leqq 0.2$, and $0.95 \leqq a \leqq 1.05$.

In the piezoelectric/electrostrictive film type device 1 of the present embodiment in which the substrate 2 is fired integrally with the piezoelectric/electrostrictive operating portion 5 in this manner, for example, compared with a case where the substrate is bonded to the piezoelectric/electrostrictive operating portion via an adhesive layer or the like using an adhesive or the like, it is possible to precisely transmit to the substrate 2 the displacement generated in the piezoelectric/electrostrictive film 4 and the piezoelectric/electrostrictive operating portion 5, and large displacements can be obtained. Since the piezoelectric/electrostrictive film 4 is literally formed into a thin film, a sufficiently large displacement can be obtained even if the piezoelectric/electrostrictive composition does not contain any lead (Pb). The piezoelectric/electrostrictive film type device is superior in piezoelectric/electrostrictive characteristic, and sufficient considerations are given even to environments.

When the substrate 2 of the piezoelectric/electrostrictive film type device 1 of the present embodiment is formed by sintering particles made of a ceramic, there is a case where the oxide of the alkali metal element or the metal element is contained inside the particles, or a case where the oxide exists (in a grain boundary) between adjacent particles. In either case, sufficient displacement can be obtained, but these oxides are preferably contained inside the particles because a larger displacement can be obtained.

It is to be noted that the oxide of the alkali metal element and the oxide of the metal element contained in the substrate 2 are derived from the alkali metal element and the metal element included in the piezoelectric/electrostrictive composition constituting the piezoelectric/electrostrictive film 4. That is, the alkali metal element (or the oxide thereof) and the metal element (or the oxide thereof) contained in the piezoelectric/electrostrictive composition gradually shift to the substrate 2 via the lower electrode film 3a, and are contained as the oxides in the substrate 2. Therefore, in the piezoelectric/electrostrictive film type device 1 of the present embodiment, the piezoelectric/electrostrictive film 4 is preferably fired and formed after forming the lower electrode film 3a on the substrate 2, because the oxides of the alkali metal element and the metal element derived from the piezoelectric/electrostrictive composition are contained in the substrate 2. The lower electrode film 3a is preferably fired and formed.

It is to be noted that each of the oxides of the alkali metal element and the metal element contained in the substrate 2 are oxides which can be identified by chemical analysis. Therefore, when the alkali metal element or the metal element is contained in the substrate 2 in a configuration which cannot be identified by the chemical analysis, or when the element is contained in the substrate 2 in a state in which the element is dissolved with another element in the substrate 2.

Figure 10:
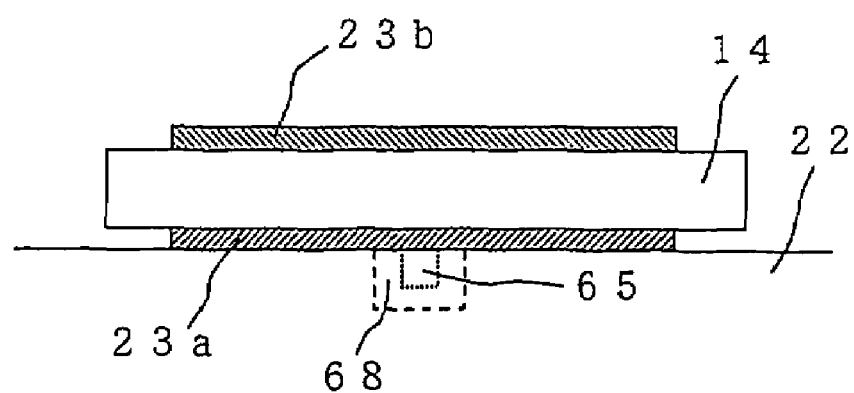
FIG. 10 is a schematic diagram showing a central portion of an interface between a substrate and a lower electrode film, and the vicinity of the central portion of the interface.

Moreover, the concentration of each of the oxide of the alkali metal element and/or the oxide of the metal element contained in a substrate 22 radically and gradually drops along a thickness direction of the substrate 22 from a central portion 65 of an interface between the substrate 22 and a lower electrode film 23a (see FIG. 10). That is, each of the oxides of the alkali metal element and the metal element are preferably contained in the substrate 2 with a concentration gradient which radically and gradually decreases from a surface provided with the piezoelectric/electrostrictive operating portion thereon toward a surface on a side opposite to the provided surface. When the oxides of the alkali metal element and the metal element are contained in the substrate 22 with the respective specific concentration gradients in this manner, larger flexural displacements can be obtained compared with a case where the oxides are evenly contained in the whole substrate 22. It is to be noted that a "central portion of an interface between the substrate and the lower electrode film" mentioned in the present specification refers to a minimum area (area denoted with 65 in FIG. 10) which can be measured with a resolution of a general electron probe microanalyzer (EPMA) in a case where element analysis is performed using this EPMA as shown in FIG. 10. To be more specific, a 500×500×500 nm area is referred to.

Moreover, assuming that the concentration of the oxide of the alkali metal element contained in a vicinity portion 68 of the central portion of the interface between the substrate 22 and the lower electrode film 23a is X, a portion in which the concentration of the oxide of the alkali metal element contained in the substrate 22 is 0.3X is preferably a portion corresponding to a distance of 10 to 90% of a thickness of the substrate 22 from the central portion of the interface, more preferably a portion corresponding to a distance of 20 to 60%. Similarly, assuming that the concentration of the oxide of the metal element contained in the vicinity portion 68 of the central portion of the interface is X, a portion in which the concentration of the oxide of the metal element contained in the substrate 22 is 0.3X is a portion corresponding to the distance of 10 to 90% of the thickness of the substrate 22 from the central portion of the interface. The portion is more preferably a portion corresponding to the distance of 20 to 60%.

When the portion in which the concentration of each of the oxides of the alkali metal element and the metal element contained in the substrate 22 is 0.3X is the portion corresponding to the distance of less than 10% of the thickness of the substrate 22 from the central portion of the interface. In this case, an effect produced by presence of the concentration gradient tends to be insufficient. On the other hand, when the portion is a portion corresponding to a distance exceeding 90%, the strength of the substrate 22 becomes insufficient, and displacement characteristics tend to degrade. It is to be noted that the "vicinity of the central portion of the interface" refers to an area having a concentration of the oxides of the alkali metal element and the metal element, which is equal to that of the "central portion of the interface between the substrate and the lower electrode film".

Moreover, as shown in FIG. 1, in the piezoelectric/electrostrictive film type device 1 of the present embodiment, the piezoelectric/electrostrictive film 4 has such a size that the piezoelectric/electrostrictive film 4 covers the lower electrode film 3$a$ and the end portions thereof (extended end portions 10) are extended over the substrate 2. The extended end portions 10 protruding onto the substrate 2, and portions (portions B corresponding to the extended end portions) of the substrate 2 corresponding to the extended end portions 10 preferably constitute incompletely bonded states in incompletely bonded portions 30. In the portions B of the substrate 2 corresponding to the extended end portions, the concentration of each of the oxides of the alkali metal element and the metal element is preferably higher as compared with a portion (lower electrode abutting portion A) on which the lower electrode 3$a$ of the substrate 2 abuts. It is assumed that the alkali metal element or the metal element contained in the piezoelectric/electrostrictive composition gradually moves toward the substrate 2 by firing, and is unevenly disposed in a predetermined portion in the substrate 2, for example, in a state of an oxide thereof. That is, when these oxides are unevenly distributed especially in the portions B of the substrate 2 corresponding to the extended end portions, even the portions B corresponding to the extended end portions are flexibly and easily displaced, and a higher displacement can be obtained, although it is presumed that the portions, which are distant from the piezoelectric/electrostrictive operating portion 5, are not comparatively easily displaced.

It is to be noted that the term "incompletely bonded state" used in the present specification refers to a state in which at least a part of each protruding end portion is bonded to the substrate, or a non-bonded state in which there is not any bonded portion. Specifically, the state refers to a bonded state to such an extent that the bonding between the extended end portions and the substrate is incomplete, and the piezoelectric/electrostrictive operating portion can sufficiently exhibit the required performance. More specifically, the peeling strength between each protruding end portion and the substrate is preferably 0.5 kg/4 mm$^2$ or less, more preferably 0.1 kg/4 mm$^2$ or less, especially preferably 0.05 kg/4 mm$^2$ (wherein "4 mm$^2$", means a 2 mm square) or less. Therefore, all of the portions in which the extended end portions are brought into contact with the substrate do not have to have the incompletely bonded state. Even when each protruding end portion is partially bonded to the substrate, the total strength may be not more than a predetermined strength.

Moreover, as to an incompletely bonded portion, a dummy layer is formed between each protruding end portion and the substrate in such a manner that they do not directly contact each other before forming the piezoelectric/electrostrictive film, and the piezoelectric/electrostrictive film may be formed via the dummy layer. The dummy layer is a layer formed of a material which burns or disappears by a predetermined thermal treatment, such as a resin material, and the incompletely bonded portion is formed after the material disappears. It is to be noted that it is possible to use a material which does not completely burn or disappear as long as the dummy layer functions as a sufficient insulating article, and the bonded state between the protruding end portion and the substrate is the above-described incompletely bonded state after the predetermined thermal treatment.

When a voltage is applied to the upper electrode film and the lower electrode film, and an electric field acts on the piezoelectric/electrostrictive film, the flexural displacement or a force generated in a direction vertical to the surface of the substrate is developed by a transverse effect of electric field induced strain in the piezoelectric/electrostrictive film. However, since the protruding end portions of the piezoelectric/electrostrictive film have an incompletely bonded state with respect to the substrate, the flexural displacement or the generated force in the piezoelectric/electrostrictive film is not substantially restricted.

Figure 2:
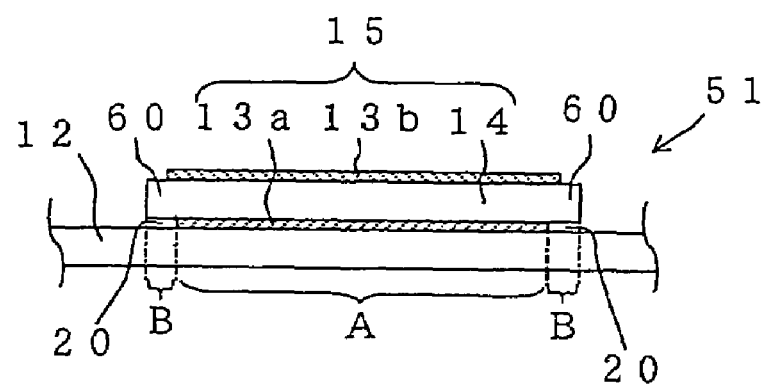
FIG. 2 is a partial sectional view schematically showing another embodiment of the piezoelectric/electrostrictive film type device according to the present invention.

Moreover, as shown in FIG. 2, in the piezoelectric/electrostrictive film type device 51 of the present embodiment, the piezoelectric/electrostrictive film 14 has such a size that the piezoelectric/electrostrictive film 14 covers a lower electrode film 13$a$ and the end portions thereof (extended end portions 60) are extended over a substrate 12. The extended end portions 60 protruding onto the substrate 12, and portions (portions B corresponding to the extended end portions) of the substrate 12 corresponding to the extended end portions 60 preferably constitute a detached state in which so-called detaching spaces 20 are interposed between the portions to thereby detach the portions from each other at predetermined intervals. When the end portions of the piezoelectric/electrostrictive film 14 and the substrate 12 are arranged in such a spatial arranged state, the extended end portions 60 do not easily inhibit the displacement of the substrate 12, the substrate 12 can be flexibly displaced, and higher displacements can be obtained. In the portions B of the substrate 12 corresponding to the extended end portions, the concentration of each of the oxides of the alkali metal element and the metal element is preferably high compared with a portion (lower electrode abutting portion A) on which the lower electrode film 13$a$ of the substrate 12 abuts. It is presumed that the alkali metal element or the metal element contained in the piezoelectric/electrostrictive composition gradually moves toward the substrate 2 by firing, and is unevenly distributed in a predetermined portion in the substrate 2, for example, in a state of the oxide thereof. When the oxides of the alkali metal element and the metal element are unevenly distributed especially in the portions B of the substrate 12 corresponding to the extended end portions, even the portions B corresponding to the extended end portions are flexibly and easily displaced, and higher displacements can be obtained, although it is presumed that the portions, which are distant from the piezoelectric/electrostrictive operating portion 15, are not comparatively easily displaced. It, is to be noted that in FIG. 2, reference numeral 13$b$ denotes an upper electrode film.

When a voltage is applied to the upper and lower electrode films, and an electric field acts on the piezoelectric/electrostrictive film, and the flexural displacement or the generated force in the direction vertical to the surface of the substrate is developed by the transverse effect of the electric field induced strain in the piezoelectric/electrostrictive film. However, since each protruding end portion of the piezoelectric/electrostrictive film is detached from the substrate at the predetermined interval, the flexural displacement or the force generated in the piezoelectric/electrostrictive film is not substantially restricted.

Moreover, in the piezoelectric/electrostrictive film type device 1 (see FIG. 1) of the present embodiment, the substrate 2 contains alumina ($Al_2O_3$), and a reaction product of the alkali metal element and alumina ($Al_2O_3$) is preferably unevenly distributed in a layer state in portions of the substrate 2 including the portions B corresponding to the extended end portions and the interface between the substrate 2 and the lower electrode film 3a. When the reaction product of the alkali metal element and alumina ($Al_2O_3$) is unevenly distributed in the layer state in these portions, the bonding property between the substrate 2 and the lower electrode film 3a is enhanced. Therefore, durability is enhanced since water or the like does not easily penetrate between the substrate 2 and the lower electrode film 3a even under high temperature and humidity conditions, for example.

Figure 3:
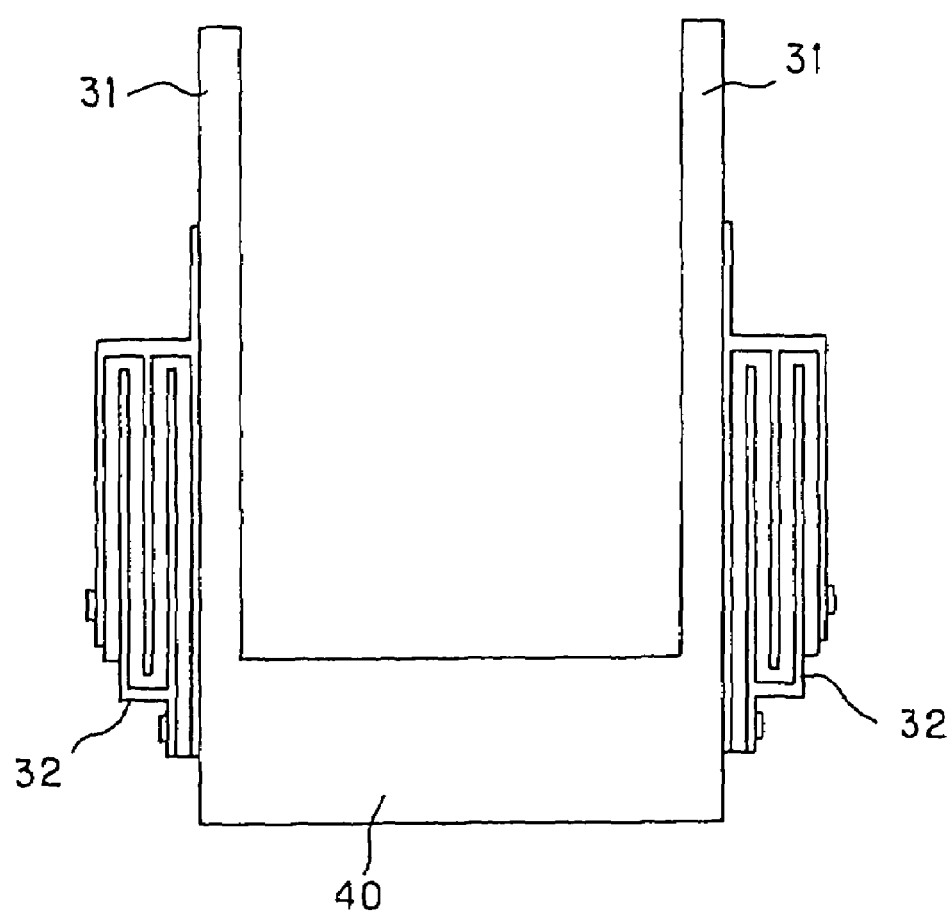
FIG. 3 is a front view showing an application example of the piezoelectric/electrostrictive film type device of the present invention to an actuator for a hard disk.

It is to be noted that it is possible to obtain an actuator for a hard disk shown in, for example, FIG. 3 by use of the piezoelectric/electrostrictive film type device of the present invention. That is, the actuator for the hard disk shown in FIG. 3 comprises a ceramic article 40 having arm portions 31 and piezoelectric/electrostrictive operating portions 32 disposed on the arm portions 31. The arm portions 31 function as vibrating plates, and the actuator has desired satisfactory vibrating characteristics.

In the piezoelectric/electrostrictive film type device of the present embodiment, the thickness of the piezoelectric/electrostrictive film is preferably 0.5 to 50 μm, more preferably 0.8 to 40 μm, and especially preferably 1.0 to 30 μm. When the thickness of the piezoelectric/electrostrictive film is less than 0.5 μm, a dense film cannot be obtained in some case. On the other hand, when the thickness of the piezoelectric/electrostrictive film exceeds 50 μm, the stress contraction of the piezoelectric/electrostrictive composition during firing increases, the substrate needs to be formed to be thicker in order to prevent the substrate from being destroyed, and it is sometimes difficult to successfully achieve miniaturization of the device.

In the present embodiment, the substrate constituting the piezoelectric/electrostrictive film type device is made of a ceramic, but there is not any special restriction on a type of ceramic. Additionally, from respects of heat resistance, chemical stability, and insulating property, the ceramic preferably contains at least one material selected from the group consisting of stabilized zirconium oxide, aluminum oxide, magnesium oxide, mullite, aluminum nitride, silicon nitride, and glass. Above all, stabilized zirconium oxide is more preferable from the viewpoint that its mechanical strength is large and its tenacity is superior. It is to be noted that the term "stabilized zirconium oxide" mentioned in the present specification refers to zirconium oxide in which phase transition of crystals is inhibited by addition of a stabilizer, and includes partially stabilized zirconium oxide in addition to stabilized zirconium oxide.

Examples of stabilized zirconium oxide include zirconium oxide containing, as the stabilizer, 1 to 30 mol % of calcium oxide, magnesium oxide, yttrium oxide, scandium oxide, ytterbium oxide, cerium oxide, or oxide of a rare earth metal. Above all, zirconium oxide containing yttrium oxide as the stabilizer is preferable because the mechanical strength of a vibrating portion is especially high. In this case, the zirconium oxide preferably contains 1.5 to 6 mol %, more preferably 2 to 4 mol % of yttrium oxide. The zirconium oxide more preferably contains 0.1 to 5 mol % of aluminum oxide. A crystal phase of stabilized zirconium oxide may be a mixed phase of a cubic system+a monoclinic system, a mixed phase of a tetragonal system+the monoclinic system, a mixed phase of the cubic system+the tetragonal system+the monoclinic system or the like. However, when a main crystal phase is the tetragonal system, or the mixed phase of the tetragonal system+the cubic system, the phase is preferable from viewpoints of strength, tenacity, and durability.

On the other hand, the ceramic constituting the substrate also preferably contains aluminum (Al). When the ceramic constituting the substrate contains aluminum (Al), the oxide of the alkali metal element or the oxide of the metal element is easily diffused in the substrate, and is easily unevenly distributed in preferable places in the substrate. It is to be noted that the content ratio of aluminum (Al) is preferably 0.01 mass % or more, more preferably 0.01 to 2 mass %.

It is to be noted that the thickness of the substrate is preferably 1 μm to 1 mm, more preferably 1.5 to 500 μm, and especially preferably 2 to 200 μm. When the thickness of the substrate is less than 1 μm, the mechanical strength of the piezoelectric/electrostrictive film type device sometimes degrades. On the other hand, when the thickness exceeds 1 mm, rigidity of the substrate with respect to the generated contraction stress increases, and the flexural displacement of the piezoelectric/electrostrictive film is sometimes reduced when voltage is applied to the piezoelectric/electrostrictive film.

There is not any special restriction on the surface shape (shape of the surface to which the lower electrode film 3a is bonded in FIG. 1) of the substrate. Examples of suitable surface shapes include a rectangular shape, a square shape, a triangular shape, an elliptic shape, a circular shape, a curved square shape, a curved rectangular shape, and a composite shape of a combination of these shapes. There is not any special restriction on the whole shape of the substrate, and the substrate may have a capsule shape having an appropriate internal space.

Examples of suitable materials for the lower electrode film or the upper electrode film include at least one metal selected from the group consisting of Pt, Pd, Rh, Au, Ag, and an alloy of them. Above all, platinum or an alloy containing platinum as a main component is preferable because its thermal resistance is high during the firing of the piezoelectric/electrostrictive film. An alloy such as Ag—Pd may be preferably used. Especially, when the lower electrode film is formed of platinum, or the alloy containing platinum as the main component, the oxide of the alkali metal element or the oxide of the metal element is easily diffused in the substrate. Moreover, platinum functions as a synthetic catalyst of the reaction product of the alkali metal and alumina, and the reaction product is preferably easily unevenly distributed in preferable places of the substrate.

The thickness of each of the lower and upper electrode films is preferably 15 μm or less, more preferably 5 μm or less. When the thickness exceeds 15 μm, the electrode film functions as a relaxing layer, and the flexural displacement is sometimes reduced. It is to be noted that the thickness of each of the lower and upper electrode films may be 0.05 μm or more from a viewpoint that the substantial function of the electrode is fulfilled.

Figure 4:
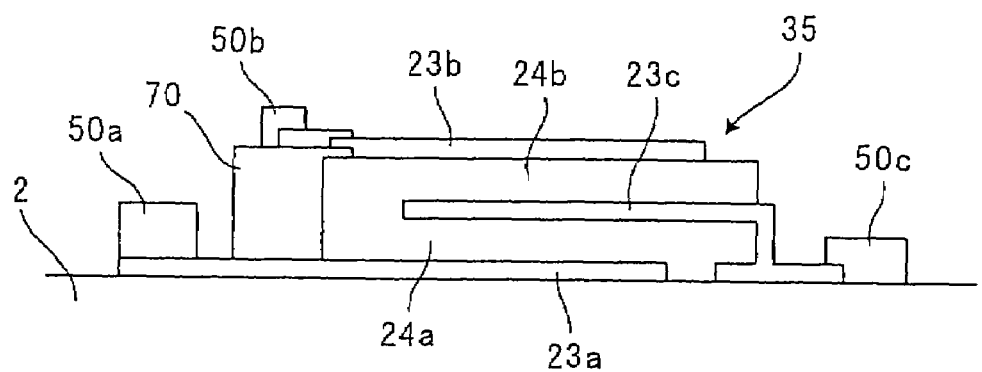
FIG. 4 is a partial sectional view schematically showing still another embodiment of the piezoelectric/electrostrictive film type device according to the present invention.

It is to be noted that as shown in FIG. 4, in the piezoelectric/electrostrictive film type device of the present embodiment, a piezoelectric/electrostrictive operating portion 35 is preferably formed into a so-called multilayered structure because a larger displacement can be obtained. The operating portion comprises a lower electrode film 23a, a first piezoelectric/electrostrictive film 24a, an internal electrode film 23c, a second piezoelectric/electrostrictive film 24b, and an upper electrode film 23b. When the piezoelectric/electrostrictive operating portion 35 is formed into such multilayered structure, there are disposed, as shown in FIG.

4, a lower electrode terminal 50a connected to the lower electrode film 23a, an internal electrode terminal 50c connected to the internal electrode film, and an upper electrode terminal 50b connected to the upper electrode film 23b. Moreover, it is preferable to adopt a wiring line pattern in which an insulating layer 70 made of an insulating material such as glass is disposed between the upper electrode terminal 50b and the lower electrode terminal 50a. That is, when a cubic wiring line pattern is constituted via the insulating layer 70, the upper electrode terminal 50b and the lower electrode terminal 50a are insulated, and can be electrically independent of each other. It is to be noted that the insulating layer itself may be interposed between the upper and lower electrode terminals without independently disposing the insulating layer constituted of the insulating material, so that the upper electrode terminal is insulated from the lower electrode terminal. This constitution is preferable in that it is possible to omit a film forming step such as screen printing. Additionally, as shown in FIG. 4, the insulating layer 70 is preferably disposed so that the upper electrode terminal can be more securely insulated from the lower electrode terminal.

Figure 5:
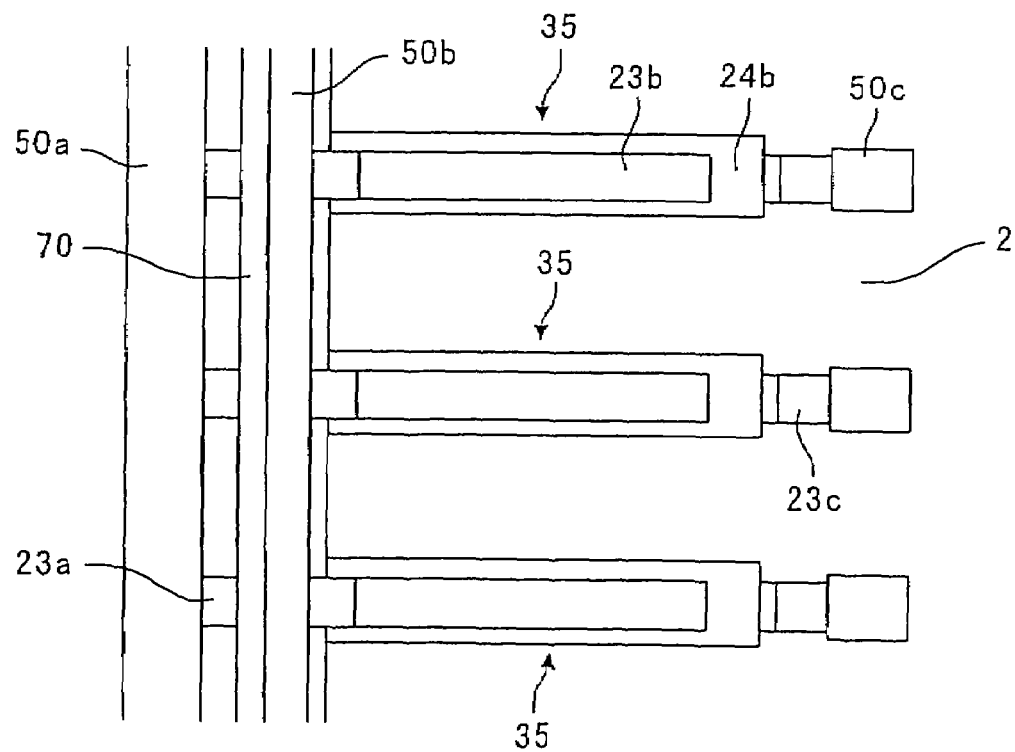
FIG. 5 is a partial plan view schematically showing a further embodiment of the piezoelectric/electrostrictive film type device according to the present invention.

Moreover, as shown in FIG. 5, in a case where there are arranged on the same substrate 2 a plurality of piezoelectric/electrostrictive operating portions 35 each having the multilayered structure, each of the lower electrode terminal 50a and the upper electrode terminal 50b is preferably constituted as a common terminal shared by the plurality of piezoelectric/electrostrictive operating portions 35, and the internal electrode terminals 50c are preferably constituted as individual terminals independent for each piezoelectric/electrostrictive operating portion. According to this wiring line, characteristics such as electrostatic capacities of the respective piezoelectric/electrostrictive operating portions 35 can be independently measured with a minimum number of terminals.

Figure 6:
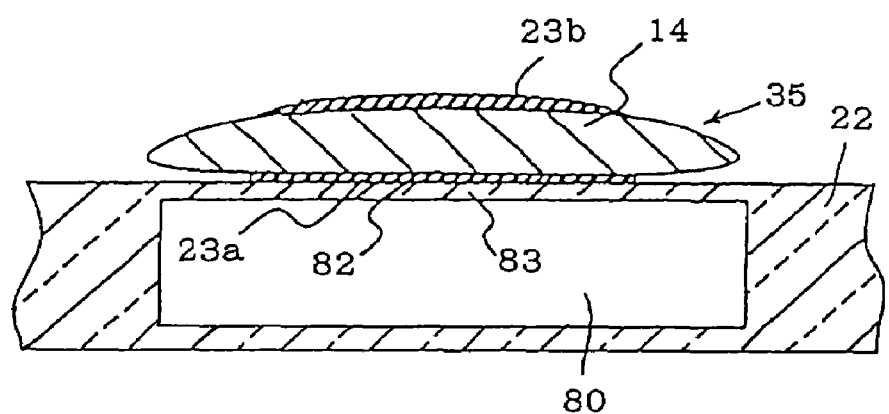
FIG. 6 is a sectional view schematically showing a further embodiment of the piezoelectric/electrostrictive film type device according to the present invention.
Figure 7:
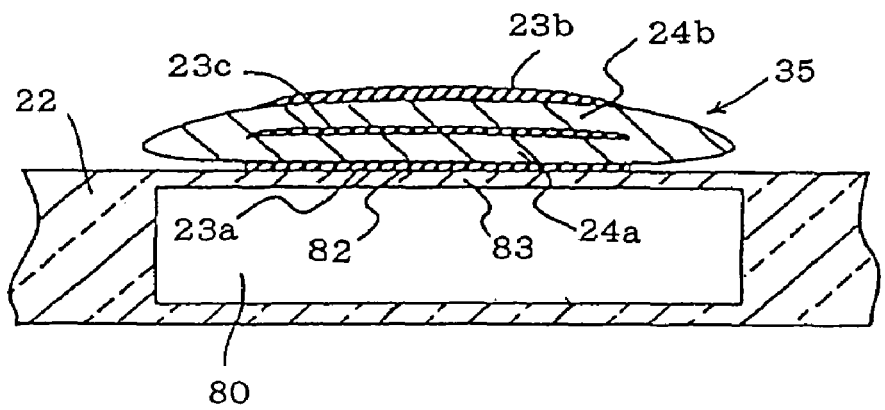
FIG. 7 is a sectional view schematically showing a further embodiment of the piezoelectric/electrostrictive film type device according to the present invention.

FIG. 6 is a sectional view schematically showing still another embodiment of the piezoelectric/electrostrictive film type device according to the present invention. As shown in FIG. 6, the piezoelectric/electrostrictive operating portion 35 which is constituted by successively laminating the lower electrode film 23a, the piezoelectric/electrostrictive film 14, and the upper electrode film 23b, may be disposed on the surface (bonding surface 82) of a substrate 22 having a cavity 80. On the other hand, as shown in FIG. 7 the piezoelectric/electrostrictive operating portion 35 having a so-called multilayered structure comprising the lower electrode film 23a, the first piezoelectric/electrostrictive film 24a, the internal electrode film 23c, the second piezoelectric/electrostrictive film 24b, and the upper electrode film 23b may be disposed on the surface (bonding surface 82) of the substrate 22 having the cavity 80.

Figure 8:
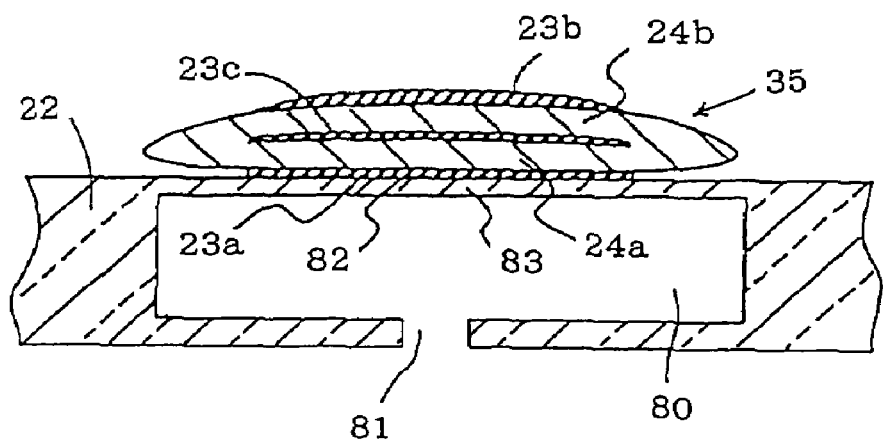
FIG. 8 is a sectional view schematically showing a further embodiment of the piezoelectric/electrostrictive film type device according to the present invention.
Figure 9:
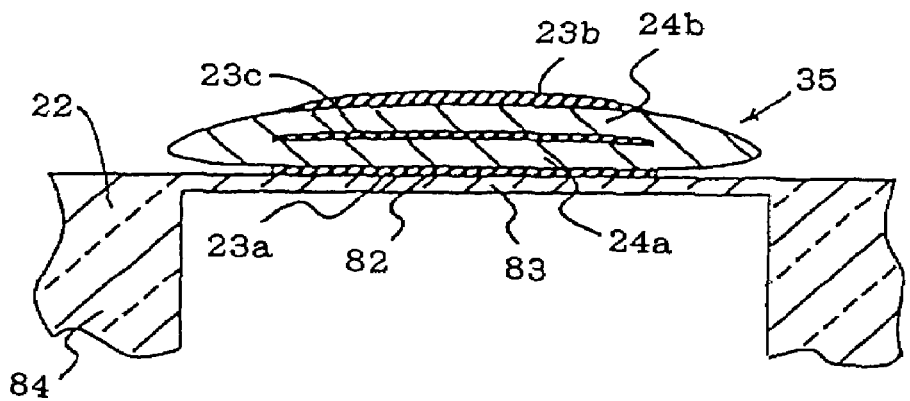
FIG. 9 is a sectional view schematically showing a further embodiment of the piezoelectric/electrostrictive film type device according to the present invention.

Moreover, as shown in FIG. 8, the piezoelectric/electrostrictive operating portion 35 having a so-called multilayered structure comprising the lower electrode film 23a, the first piezoelectric/electrostrictive film 24a, the internal electrode film 23c, the second piezoelectric/electrostrictive film 24b, and the upper electrode film 23b may be disposed on the surface (bonding surface 82) of the substrate 22 having the cavity 80 in which a predetermined hole portion 81 is formed. Furthermore, when the substrate 22 has a thin portion 83 and a thick portion 84 as shown in FIG. 9, the piezoelectric/electrostrictive operating portion 35 may be disposed on the surface (bonding surface 82) of the thin portion 83.

Next, an embodiment of a method of manufacturing the piezoelectric/electrostrictive film type device according to the present invention will be described. The method of manufacturing the piezoelectric/electrostrictive film type device of the present embodiment is a method of manufacturing a piezoelectric/electrostrictive film type device comprising a thin substrate made of a ceramic and a piezoelectric/electrostrictive operating portion disposed on the substrate. The piezoelectric/electrostrictive operating portion is constituted by successively laminating a lower electrode film, a piezoelectric/electrostrictive film containing a large number of crystal particles constituted of a piezoelectric/electrostrictive composition, and an upper electrode film. In the manufacturing method of the present embodiment, a piezoelectric/electrostrictive composition which satisfies the following conditions (1) is disposed and fired as a layer on the lower electrode film to thereby form the piezoelectric/electrostrictive film.

The conditions (1) include that the piezoelectric/electrostrictive composition is prepared using one or more of a plurality of material compounds containing one or more alkali metal elements selected from the group consisting of lithium (Li), potassium (K), and sodium (Na) and one or more metal elements selected from the group consisting of niobium (Nb), tantalum (Ta), antimony (Sb), and silver (Ag) among contained constituting elements, wherein an amount of the material compound being larger than a theoretical necessary amount calculated from a general formula representing the piezoelectric/electrostrictive composition constituting the crystal particles contained in the piezoelectric/electrostrictive film to be formed.

A method of preparing a piezoelectric/electrostrictive composition which satisfies the above-described conditions (1) is described below. A conventional piezoelectric/electrostrictive composition is prepared by mixing each element alone constituting the composition, oxide of each element, carbonate, a compound containing a plurality of types of elements or the like in such a manner that the content of each element indicates a desired composition ratio. On the other hand, in the present embodiment, the piezoelectric/electrostrictive composition for use in the method of manufacturing the piezoelectric/electrostrictive film type device may be prepared using one or more of the plurality of material compounds each containing one or more alkali metal elements selected from the group consisting of lithium (Li), potassium (K), and sodium (Na), and one or more metal elements selected from the group consisting of niobium (Nb), tantalum (Ta), antimony (Sb), and silver (Ag) among the contained constituting elements. The amount of the material compound for use is larger than the theoretical necessary amount calculated from the general formula representing the piezoelectric/electrostrictive composition constituting the crystal particles contained in the piezoelectric/electrostrictive film to be formed. When the specific constituting element is used in more than the theoretical necessary amount in this manner, the oxide of the alkali metal element and/or the oxide of the metal element can be contained in the substrate.

It is to be noted that the composition is "prepared using more than the theoretical necessary amount calculated from the general formula representing the composition of the piezoelectric/electrostrictive composition constituting the crystal particles contained in the piezoelectric/electrostrictive film to be formed", for example, in the following first to third steps.

First, the piezoelectric/electrostrictive film type device is tentatively prepared using the material compound in accordance with the theoretical necessary amount calculated from the general formula representing the piezoelectric/electrostrictive composition constituting the crystal particles contained in the piezoelectric/electrostrictive film to be formed (first step). Next, the tentatively prepared piezoelectric/electrostrictive film type device is chemically analyzed, and an amount of each element diffused in the substrate, and a content in the piezoelectric/electrostrictive film are calculated from a deviation amount from the theoretical necessary amount with respect to all elements that have moved to the substrate (second step). Thereafter, the piezoelectric/electrostrictive film type device is prepared using the material compound more than the theoretical necessary amount based on the calculated amount diffused in the substrate and the calculated content in the piezoelectric/electrostrictive film (third step). It is to be noted that when the first and second steps are repeated, preparation precision can be enhanced. Alternatively, it is preferable to prepare a conversion table of the amount of each element diffused in the substrate and the content of each element in the piezoelectric/electrostrictive film with respect to the amount of the material compound used from the results of the tentative preparation. According to the prepared conversion table, the piezoelectric/electrostrictive composition constituting the crystal particles contained in the piezoelectric/electrostrictive film to be formed can be represented by a desired general formula. The amount of the alkali metal element or the metal element contained in the substrate can be adjusted into a desired amount.

It is to be noted that the material compound is preferably used in an amount that is 1 to 25 mass % more than the theoretical necessary amount in terms of the alkali metal element and the metal element contained in each of the compounds. Especially, the material compound containing the alkali metal element or niobium (Nb) is used more by preferably 15 mass % or less, more preferably 1 to 5 mass % in terms of the element (in terms of Li, K, Na, or Nb) contained in each compound as compared with the theoretical necessary amount. When the surplus amount of the material compound exceeds 15 mass % in terms of the element, the amount of the oxide of the alkali metal element or the oxide of niobium (Nb) contained in the substrate becomes excessive, and the strength of the substrate tends to be insufficient. Material compounds containing tantalum (Ta), antimony (Sb), or silver (Ag) are more preferably used in amounts of 25 mass % or less, more preferably 5 to 20 mass % in terms of the element (in terms of Ta, Sb, or Ag) contained in each compound as compared with the theoretical necessary amount. When the surplus amount of the material compound exceeds 25 mass % in terms of the element, the amount of the oxide of tantalum (Ta) or the oxide of antimony (Sb) contained in the substrate becomes excessive, and the strength of the substrate tends to be insufficient.

As a method of mixing the material compounds, a general method may be used, and examples of the method include a ball mill. Specifically, predetermined amounts of each type of material compound, balls, and dispersion medium (water, organic solvent) are disposed in a ball mill device, and the device is rotated for a predetermined time to prepare a mixed slurry. Thereafter, a dispersion medium content (water or organic solvent content) contained in the resultant mixed slurry is evaporated, dried, filtered, or removed otherwise so that a mixed material can be obtained.

When the resultant mixed material is fired, the piezoelectric/electrostrictive composition can be obtained. The firing may be performed in atmospheric air or an oxygen atmosphere. As to the resultant piezoelectric/electrostrictive composition, in a diffraction strength by an X-ray diffraction device, the ratio of the strength of the strongest diffraction line of a phase other than a perovskite phase to that of the strongest diffraction line of the perovskite phase is preferably 5% or less, more preferably 2% or less.

When the resultant piezoelectric/electrostrictive composition is crushed using a general crushing device such as a ball mill, an attritor, or a beads mill, it is possible to obtain a particulate (or powdered) piezoelectric/electrostrictive composition. The average particle diameter of the particulate piezoelectric/electrostrictive composition is preferably 0.1 to 1.0 µm, more preferably 0.2 to 0.7 µm. It is to be noted that the particle diameter may be adjusted by a thermal treatment of the resultant powder of the crushed piezoelectric/electrostrictive composition at a predetermined temperature. In this case, finer particles are integrated with the other particles to constitute a powder having a uniform particle diameter, and it is preferably possible to form the piezoelectric/electrostrictive film having a uniform particle diameter. The piezoelectric/electrostrictive composition may be prepared by an alkoxide process, a coprecipitation process or the like. It is to be noted that the method of preparing the piezoelectric/electrostrictive composition material is described in more detail in Patent Documents 3 to 6 mentioned above.

To manufacture the piezoelectric/electrostrictive film type device of the present embodiment, first, the lower electrode film is formed on the thin substrate made of the ceramic. Examples of a method of forming the lower electrode film include ion beam, sputtering, vacuum evaporation, PVD, ion plating, CVD, plating, aerosol deposition, screen printing, spraying, and dipping. Above all, the sputtering method or the screen printing method is preferable in respect of a bonding property to the substrate and the piezoelectric/electrostrictive film. As to the formed lower electrode film, an appropriate temperature is selected depending on the material of the film, and the film can be integrated with the substrate by the thermal treatment at about 800 to 1400° C. Next, the piezoelectric/electrostrictive composition is formed in the layer state on the lower electrode film.

Example of a method of disposing the piezoelectric/electrostrictive composition in the layer state on the lower electrode film include ion beam, sputtering, vacuum evaporation, PVD, ion plating, CVD, plating, sol-gel, aerosol deposition, screen printing, spraying, and dipping. Above all, screen printing is preferable because the layer can easily be continuously disposed into a highly precise shape and thickness. After disposing the layer constituted of the piezoelectric/electrostrictive composition on the lower electrode film, the layer is fired, so that the piezoelectric/electrostrictive film having the piezoelectric/electrostrictive composition can be formed. The firing temperature is preferably 950 to 1350° C., more preferably 1000 to 1300° C. the time for retaining the maximum temperature during firing is preferably ten minutes or more and ten hours or less, more preferably 20 minutes or more and five hours or less. The firing may be performed in the atmospheric air or an oxygen atmosphere.

It is to be noted that when the amount of the alkali metal element used is large, the material can be fired at a lower temperature. Moreover, in order to contain a sufficient amount of the oxide of the alkali metal element or the metal element in the substrate, the material is preferably retained at the maximum temperature for an appropriate time during firing. The time for retaining the material at the maximum temperature may be appropriately set depending on the surplus amount of the material compound. When the surplus amount of the material compound is larger, the time for retaining the material at the maximum temperature is preferably set to be longer. It is to be noted that even when the firing temperature is set to be higher by 10 to 50° C. as compared with a compacting temperature of the piezoelectric/electrostrictive composition, the oxide of the alkali metal element or the metal element can be contained in the substrate. Additionally, the time for retaining the material at the maximum temperature is preferably appropriately set in order to control the concentration gradient of the oxide of the alkali metal element or the like inside the substrate more strictly.

When the amount of the material compound and the firing temperature of the material compound, or the amount of the material compound and the retaining time of the material compound are appropriately set and combined, it is possible to control the concentration gradient of the oxide of the alkali metal element or the metal element contained in the substrate. It is to be noted that a temperature rise speed at the firing time is preferably 10 to 600° C./h, more preferably 100 to 300° C./h. When the temperature rise speed is adjusted, a positional relation between the protruding end portion and the portion corresponding to the protruding end portion can be brought into an incompletely bonded state or a detached state. When a first layer having a large organic matter content and a low powder filling ratio, and a second layer having a lower organic matter content and a high powder filling ratio compared with the first layer are formed by screen printing during the step of disposing the piezoelectric/electrostrictive composition as a layer, contact points between the formed piezoelectric/electrostrictive film and substrate are reduced by degreasing and firing, so that the bonding force between the piezoelectric/electrostrictive film and the substrate can be reduced. Furthermore, when the powder filling ratio of the first layer is adjusted, the positional relation between the protruding end portion and the portion corresponding to the protruding end portion can be brought into the incompletely bonded state or the detached state.

Next, the upper electrode film is formed on the piezoelectric/electrostrictive film. A method of forming the upper electrode film is similar to the method of forming the lower electrode film. Thereafter, a polarization treatment is performed on appropriate conditions. In this case, the polarization treatment is preferably performed by heating as in a known method. It is to be noted that a heating temperature depends on Curie point of the piezoelectric/electrostrictive composition, and is preferably set at 40 to 200° C.

EXAMPLES

The present invention will be specifically described hereinafter based on examples, but the present invention is not limited to these examples. There will be described methods of measuring various physical values, and methods of evaluating characteristics.

Flexural Displacement: The flexural displacement (μm) generated by applying a voltage between the upper and lower electrode films in such a manner so as to obtain an electric field of 3 kV/mm was measured with a laser displacement measurement unit. It is to be noted that in the Tables, the reported "average" of the "flexural displacement (μm)" is an average value in a case where ten piezoelectric/electrostrictive film type devices were manufactured in each of an example and a comparative example, and the flexural displacements of the devices were measured. The "fluctuation" refers to the difference between a maximum value and a minimum value of the measured flexural displacement.

Concentration of Various Types of Oxides contained in Substrate: When a section obtained by cutting a piezoelectric/electrostrictive film type device in parallel with a laminating direction was analyzed with an electron probe microanalyzer (EPMA) (model number "JXA-8800 type" manufactured by JEOL Ltd.), the concentrations of various types of oxides contained in the substrate were measured, along with their positions in the substrate.

Durability: A piezoelectric/electrostrictive film type device was subjected to a high acceleration test by driving the device under the conditions of 85° C. and 85% humidity for a long time. The time required for the flexural displacement to decrease by 15% from an initial value was measured as an index of durability.

Strength of Substrate: The bending strength and elasticity were measured using an analogous dimension sample defined in JIS R1601 and JIS R1602. As a result, substrates were evaluated as "○" when the total of a residual stress resulting from a thermal expansion difference between a piezoelectric/electrostrictive film and the substrate, and a stress applied to the substrate at a piezoelectric driving time was smaller than the bending strength. Furthermore, assuming that the thickness of the piezoelectric/electrostrictive film was $t_1$, the elasticity of the piezoelectric/electrostrictive film was $E_1$, the thickness of the substrate was $t_2$, the elasticity of the substrate was $E_2$, the thickness of the electrode was $t_3$, and the elasticity of the electrode was $E_3$, when a value represented by $\{(E_2 \times t_2)+(E_3 \times t_3)\}/(E_1 \times t_1)$ is larger than 1, the substrate was evaluated as "◎".

Circle Equivalent Diameters of 90% or more of Crystal Particles: An arbitrary cut section of the piezoelectric/electrostrictive film was subjected to image analysis using SEM, and an occupying area of each crystal particle of the piezoelectric/electrostrictive composition was measured. Next, a diameter of a circle having an area equal to the measured occupying area was calculated as the "circle equivalent diameters" of the crystal particles, and the "circle equivalent diameters of 90% or more of crystal particles" were calculated.

Examples 1 to 8, Comparative Examples 1, 2

On a substrate (1.6×1.1 mm×thickness of 100 μm) made of zirconia ($ZrO_2$) formed by a green sheet laminating process, fired, and stabilized by yttria ($Y_2O_3$), a lower electrode film (1.2×0.8 mm×thickness of 3 μm) made of platinum (Pt) was formed by a screen printing process, and formed integrally with the substrate by a thermal treatment at 1300° C. for two hours. On the lower electrode film, each piezoelectric/electrostrictive composition represented by a predetermined composition formula was laminated with a dimension 1.3×0.9 mm×thickness of 15 μm by the screen printing process. It is to be noted that the piezoelectric/electrostrictive composition was laminated by performing the printing twice to prepare: (1) a composition in which an organic matter content of a first layer was set to be larger by 10 mass % than that of a second layer (detached state); and (2) a composition in which the organic matter content of the first layer was set, to be equal to that of the second layer (incompletely bonded state). Subsequently, firing was performed at 1200° C. for three hours (in Examples 20 to 25, Comparative Examples 4, 5), or 1000° C. for three hours (in Examples 26, 27) to prepare a piezoelectric/electrostrictive film. On the formed piezoelectric/electrostrictive film, an upper electrode film (1.2×0.8 mm×thickness of 0.5 μm) made of gold (Au) was laminated by the screen printing process, and thermally treated to manufacture the piezoelectric/electrostrictive film type device (Examples 1 to 8, Comparative Examples 1, 2). Table 8 shows the composition formula of the piezoelectric/electrostrictive composition constituting each formed piezoelectric/electrostrictive film. It is to be noted that, as a result of analysis with EPMA, it has been found that each of the substrates of the piezoelectric/electrostrictive film type devices of Examples 1 to 8 contains an oxide of an alkali metal element and an oxide of a metal element. Table 1 shows measurement results of flexural displacements of the resultant piezoelectric/electrostrictive film type devices, and evaluation results of durability.

pound containing potassium (K), sodium (Na), niobium (Nb), and tantalum (Ta), respectively, more by 3 mass % in terms of the element as compared with a theoretical necessary amount calculated from a general formula "$(Li_{0.06}K_{0.45}Na_{0.49})_{0.991}(Nb_{0.92}Ta_{0.08})O_3$". On the lower electrode film, the material was laminated with a dimension 1.3×0.9 mm×thickness of 15 μm by the screen printing process, and fired at 1000° C. for three hours. Furthermore, on the composition, an upper electrode film (1.2×0.8 mm×thickness of 0.5 μm) made of gold (Au) was laminated by the screen printing process, and thermally treated to

TABLE 1

| | Composition formula of piezoelectric/electrostrictive composition | State of protruding end portion | Flexural displacement (μm) | Fluctuation of flexural displacement (μm) | Durability |
|---|---|---|---|---|---|
| Example 1 | $(Na_{0.52}K_{0.38}Li_{0.05}Ag_{0.005})NbO_3$ | Incompletely bonded state | 1.13 | 0.07 | >1000 h |
| Example 2 | | Detached state | 1.3 | 0.07 | >900 h |
| Example 3 | $(Ag_{0.90}Li_{0.10})(Nb_{0.80}Ta_{0.20})O_3$ | Incompletely bonded state | 1.2 | 0.09 | >1000 h |
| Example 4 | | Detached state | 1.35 | 0.09 | >900 h |
| Example 5 | $(Li_{0.04}K_{0.48}Na_{0.48})(Nb_{0.86}Ta_{0.10}Sb_{0.04})O_3$ | Incompletely bonded state | 1.19 | 0.09 | >1200 h |
| Example 6 | | Detached state | 1.4 | 0.09 | >1000 h |
| Example 7 | $(Li_{0.06}Na_{0.45})_{0.991}(Nb_{0.92}Ta_{0.08})O_3$ | Incompletely bonded state | 2 | 0.09 | >1200 h |
| Example 8 | | Detached state | 2.2 | 0.09 | >1000 h |
| Comparative Example 1 | $Pb(Ti_{0.47}Zr_{0.53})O_3$ | Incompletely bonded state | 0.89 | 0.13 | >1200 h |
| Comparative Example 2 | | Detached state | 0.91 | 0.13 | >1000 h |

From the results shown in Table 1, it has been found that the piezoelectric/electrostrictive film type devices of Examples 1 to 8 exhibit sufficient flexural displacements, and less fluctuations of the flexural displacements compared with those of Comparative Examples 1, 2. It is also evident that the piezoelectric/electrostrictive film type devices of Examples 1 to 8 exhibit sufficient durability.

Example 9

On a substrate (1.6×1.1 mm×thickness of 100 μm) made of zirconia ($ZrO_2$) formed by a green sheet laminating process, fired, and stabilized by yttria ($Y_2O_3$), a lower electrode film (1.2×0.8 mm×thickness of 3 μm) made of platinum (Pt) was formed by a screen printing process, and formed integrally with the substrate by a thermal treatment at 1300° C. for two hours. A piezoelectric/electrostrictive composition material was obtained using a material compound containing potassium (K), sodium (Na), niobium (Nb), and tantalum (Ta), respectively, more by 3 mass % in terms of the element as compared with a theoretical necessary amount calculated from a general formula manufacture a piezoelectric/electrostrictive film type device (Example 9).

The concentrations of various types of oxides contained in the substrate of the resultant piezoelectric/electrostrictive film type device were measured for each position in the substrate. The results are shown in Table 2. Table 2 shows measurement results of flexural displacements. It is to be noted that the term "concentration (relative value) of the oxide" in Table 2 refers to a relative value assuming that the concentration of the oxide contained in the vicinity (position (μm) from an interface: 0) of the interface between the substrate and the lower electrode film is "100."

TABLE 2

| | Distance from interface (μm) | Concentration (relative value) of oxide | | | | Flexural displacement (μm) |
|---|---|---|---|---|---|---|
| | | Potassium (K) | Sodium (Na) | Niobium (Nb) | Tantalum (Ta) | |
| Example 9 | 0 | 100 | 100 | 100 | 100 | 1.8 |
| | 20 | 85 | 95 | 76 | 95 | |
| | 40 | 64 | 20 | 52 | 92 | |
| | 60 | 45 | 5 | 43 | 90 | |
| | 80 | 25 | 0 | 22 | 87 | |
| | 100 | 0 | 0 | 0 | 88 | |

Example 10

A piezoelectric/electrostrictive film type device (Example 10) was manufactured in the same manner as in Example 9 described above, except that a material compound containing tantalum (Ta) was used in an amount of 15 mass % more in terms of the element as compared with a theoretical necessary amount calculated from a general formula "$(Li_{0.06}K_{0.45}Na_{0.49})_{0.991}(Nb_{0.92}Ta_{0.08})O_3$." The concentration of the oxide of tantalum (Ta) contained in the substrate of the resultant piezoelectric/electrostrictive film type device was measured for each position in the substrate. The results are shown in Table 3. Table 3 shows measurement results of flexural displacements. It is to be noted that the term "concentration (relative value) of tantalum (Ta) oxide" in Table 3 refers to a relative value assuming that the concentration of tantalum (Ta) oxide contained in the vicinity (position (μm) from an interface: 0) of the interface between the substrate and the lower electrode film is "100."

TABLE 3

|  | Distance from interface (μm) | Concentration of tantalum (Ta) oxide (relative value) | Flexural displacement (μm) |
| --- | --- | --- | --- |
| Example 10 | 0 | 100 | 2.0 |
|  | 20 | 90 |  |
|  | 40 | 77 |  |
|  | 60 | 62 |  |
|  | 80 | 44 |  |
|  | 100 | 35 |  |
| Example 9 | — | — | 1.8 |

From the results of Table 3, it has been found that the piezoelectric/electrostrictive film type device of Example 10 has a larger flexural displacement than that of the piezoelectric/electrostrictive film type device of Example 9.

Examples 11 to 14

Piezoelectric/electrostrictive film type devices (Examples 11 to 14) were manufactured in the same manner as in Example 9 described above, except that a material compound containing potassium (K) was used in an amount of 0 to 30 mass % more in terms of the element, compared with the theoretical necessary amount calculated from a general formula "$(Li_{0.06}K_{0.45}Na_{0.49})O_{0.991}(Nb_{0.92}Ta_{0.08})O_3$," and the firing conditions shown in Table 4 were used. There was measured the distance from an interface, in which a concentration of an oxide of potassium (K) contained in a substrate of the resultant piezoelectric/electrostrictive film type device was 0.3X with respect to a concentration X of potassium (K) oxide contained in the vicinity of an interface between the substrate and a lower electrode film. Results are shown in Table 4.

From the results shown in Table 4, it has been found that a displacement characteristic is especially satisfactory when the distance from the interface, in which the concentration of potassium (K) oxide is 0.3X, is 10 to 90 μm (10 to 90%).

Examples 15, 16

Piezoelectric/electrostrictive film type devices (Examples 15, 16) were manufactured in the same manner as in Example 9 described above except that a material compound containing potassium (K), sodium (Na), niobium (Nb), and tantalum (Ta), respectively, was used in an amount of 3 mass % more in terms of the element compared with a theoretical necessary amount calculated from a general formula "$(Li_{0.06}K_{0.45}Na_{0.49})O_{0.991}(Nb_{0.92}Ta_{0.08})O_3$," a material compound containing tantalum (Ta) was used in an amount of 10 mass % more in terms of the element compared with the theoretical necessary amount calculated from the general formula, the firing temperature shown in Table 5 was set, the piezoelectric/electrostrictive composition material was laminated by performing printing twice, and the organic matter content of a first layer was changed. It is to be noted that during the firing, the time for retaining the material at a maximum temperature was three hours. The piezoelectric/electrostrictive composition material was laminated by printing performed twice to prepare (1) a composition in which the organic matter content of the first layer was set to be 10 mass % larger than that of a second layer (detached state); and (2) a composition in which the organic matter content of the first layer was set to be equal to that of the second layer (incompletely bonded state). There was measured a distance from an interface, in which a concentration of potassium (K) oxide contained in a substrate of the resultant piezoelectric/electrostrictive film type device was 0.3X with respect to a concentration X of potassium (K) oxide contained in the vicinity of the interface between the substrate and a lower electrode film. Results are shown in Table 5. Moreover, measurement results of flexural displacements and evaluation results of durability are shown in Table 5.

TABLE 4

|  | Surplus amount of material compound containing potassium (K) (mass %) | Calcining conditions (temperature, time) | | | | | |
| --- | --- | --- | --- | --- | --- | --- | --- |
|  |  | 900° C., 3 h | | 1000° C., 3 h | | 1100° C., 3 h | |
|  |  | Distance from interface with concentration of 0.3X (μm) | Flexural displacement (μm) | Distance from interface with concentration of 0.3X (μm) | Flexural displacement (μm) | Distance from interface with concentration of 0.3X (μm) | Flexural displacement (μm) |
| Example 11 | 0.5 | 7 | 1.40 | 10 | 1.69 | 30 | 1.80 |
| Example 12 | 3 | 10 | 1.68 | 40 | 2.00 | 75 | 1.55 |
| Example 13 | 5 | 10 | 1.69 | 50 | 2.00 | >100 | 1.05 |
| Example 14 | 30 | 24 | 1.13 | >100 | 1.10 | >100 | 0.96 |

TABLE 5

| | Calcining temperature (° C.) | State of protruding end portion | Distance from interface in which concentration of potassium (K) oxide os 0.3 X (μm) | Flexural displacement (μm) | Durability Durability |
|---|---|---|---|---|---|
| Example 15 | 1000 | Incompletely bonded state | 60 | 2.0 | >1200 h |
| Example 16 | 1000 | Detached state | 50 | 2.2 | >1000 h |

From the results shown in Table 5, it has been found that the piezoelectric/electrostrictive film type devices of Examples 15, 16 exhibit sufficient flexural displacements, and sufficient durability.

Examples 17 to 21

Piezoelectric/electrostrictive film type devices of Examples 17 to 21 were manufactured in the same manner as Example 15 described above, except that the amount (surplus amount) of the material compound containing potassium (K), and the firing temperature were changed as shown in Table 6. There was measured a distance from an interface, in which the concentration of potassium (K) oxide contained in the substrate of the resultant piezoelectric/electrostrictive film type device was 0.3X with respect to a concentration X of potassium (K) oxide contained in the vicinity of the interface between the substrate and the lower electrode film. Results are shown in Table 6. Moreover, the measurement results of flexural displacements and evaluation results of durability are shown in Table 6.

Examples 22 to 28 on a substrate (1.6×1.1 mm×thickness of 100 μm) made of zirconia ($ZrO_2$) formed by a green sheet laminating process, fired, and stabilized by yttria ($Y_2O_3$), a lower electrode film (1.2×0.8 mm×thickness of 3 μm) made of platinum (Pt) was formed by a screen printing process, and formed integrally with the substrate by a thermal treatment at 1300° C. for two hours. On the lower electrode film, each piezoelectric/electrostrictive composition represented by a composition formula "$(Li_{0.06}Na_{0.49}K_{0.45})_{0.991}(Nb_{0.92}Ta_{0.08})O_3$" was laminated with a dimension 1.3×0.9 mm×thickness of 15 μm by the screen printing process. Next, the composition was fired under the firing conditions shown in Table 7 to form a piezoelectric/electrostrictive film. On the formed piezoelectric/electrostrictive film, an upper electrode film (1.2×0.8 mm×thickness of 0.5 μm) made of gold (Au) was laminated by screen printing process, and thermally treated to manu-

TABLE 6

| | Surplus amount (mass %) | Calcining temperature ° C. | Distance from interface in which concentration of potassium (K) oxide is 0.3 X (μm) | Average of flexural displacement (μm) | Strength of substrate |
|---|---|---|---|---|---|
| Example 17 | 30 | 1000 | 100 | 1.1 | ○ |
| Example 18 | 3 | 1000 | 50 | 2.0 | ◎ |
| Example 19 | 1 | 1000 | 20 | 1.8 | ◎ |
| Example 20 | 0.5 | 1000 | 10 | 1.2 | ◎ |
| Example 21 | 0 | 900 | 0 | 1.0 | ◎ |

From the results shown in Table 6, it has been found that the piezoelectric/electrostrictive film type devices had sufficient flexural displacement and substrate strength. It is evident that the displacement is especially large when the distance from the interface, in which the concentration of potassium (K) oxide is 0.3X, is 20 μm (Example 19), and 50 μm (Example 18).

facture the piezoelectric/electrostrictive film type devices (Examples 22 to 28). Table 7 shows the measurement results of an average particle diameter of crystal particles contained in the piezoelectric/electrostrictive film of the resultant piezoelectric/electrostrictive film type devices, the circle equivalent diameters of 90% or more of crystal particles among the crystal particles, and flexural displacements.

TABLE 7

| | Composition formula of piezoelectric/electrostrictive composition | Average particle diameter of crystal particles (μM) | Calcining conditions | Circle equivalent diameter of 90% or more or crystal particles (μM) | Flexural displacement (μM) |
|---|---|---|---|---|---|
| Example 22 | $(Li_{0.06}N_{0.49}K_{0.45})_{0.991}(Nb_{0.92}Ta_{0.08})O_3$ | 0.5 | 900° C. × 10 min | 0.3-0.5 | 1.8 |
| Example 23 | $(Li_{0.06}N_{0.49}K_{0.45})_{0.991}(Nb_{0.92}Ta_{0.08})O_3$ | 0.5 | 950° C. × 20 min | 1-3 | 2.1 |
| Example 24 | $(Li_{0.06}N_{0.49}K_{0.45})_{0.991}(Nb_{0.92}Ta_{0.08})O_3$ | 0.5 | 950° C. × 3 h | 2-5 | 2.2 |
| Example 25 | $(Li_{0.06}N_{0.49}K_{0.45})_{0.991}(Nb_{0.92}Ta_{0.08})O_3$ | 0.7 | 950° C. × 3 h | 2-5 | 2.2 |
| Example 26 | $(Li_{0.06}N_{0.49}K_{0.45})_{0.991}(Nb_{0.92}Ta_{0.08})O_3$ | 1.2 | 950° C. × 3 h | 1-2 | 1.9 |
| Example 27 | $(Li_{0.06}N_{0.49}K_{0.45})_{0.991}(Nb_{0.92}Ta_{0.08})O_3$ | 0.5 | 1000° C. × 3 h | 5-20 | 2.0 |
| Example 28 | $(Li_{0.06}N_{0.49}K_{0.45})_{0.991}(Nb_{0.92}Ta_{0.08})O_3$ | 0.5 | 1050° C. × 10 min | 20-50 | 1.9 |

It is apparent from results shown in Table 7 that the piezoelectric/electrostrictive film type devices had a sufficient displacement and substrate strength. Above all, it is apparent that in the piezoelectric/electrostrictive film type devices of Examples 24, 25, in which the circle equivalent diameters of 90% or more of crystal particles are 2 to 5 μm, the flexural displacement was especially large.

According to the present invention, a piezoelectric/electrostrictive film type device is provided which exhibits superior piezoelectric/electrostrictive characteristics, and preferably used in applications such as actuators, sensors or the like.

What is claimed is:

1. A piezoelectric/electrostrictive film device comprising: a thin ceramic substrate; and
a piezoelectric/electrostrictive operating portion disposed on the ceramic substrate and comprising a lower electrode film, a piezoelectric/electrostrictive film including a large number of crystal particles having a piezoelectric/electrostrictive composition, and an upper electrode film successively laminated on the ceramic substrate;
wherein the piezoelectric/electrostrictive composition excludes lead (Pb) and comprises one or more alkali metal elements selected from the group consisting of lithium (Li), potassium (K), and sodium (Na), and at least niobium (Nb) from among one or more metal elements selected from the group consisting of niobium (Nb), tantalum (Ta), antimony (Sb), and silver (Ag); and
wherein at least one of the alkali metal element and the metal element of the piezoelectric/electrostrictive composition is present and unevenly dispersed in the ceramic substrate.

2. The piezoelectric/electrostrictive film device according to claim 1, wherein the piezoelectric/electrostrictive film has such a size that the piezoelectric/electrostrictive film covers the lower electrode film and end portions of the piezoelectric/electrostrictive film protrude to extend onto the ceramic substrate; and
wherein the protruding end portions of the piezoelectric/electrostrictive film that extend onto the ceramic substrate are detached from portions of the ceramic substrate corresponding to the positions of the protruding end portions of the piezoelectric/electrostrictive film at a predetermined interval.

3. The piezoelectric/electrostrictive film device according to claim 2, wherein a concentration of each of the alkali metal element and the metal element of the piezoelectric/electrostrictive composition that is present in the ceramic substrate is higher in the portions of the ceramic substrate corresponding to the positions of the protruding end portions of the piezoelectric/electrostrictive film than in a vicinity of an interface between the ceramic substrate and the lower electrode film.

4. The piezoelectric/electrostrictive film device according to claim 2, wherein the substrate comprises alumina ($Al_2O_3$), and wherein a reaction product of the alkali metal element of the piezoelectric/electrostrictive composition and the alumina ($Al_2O_3$) of the ceramic substrate is unevenly distributed as a layer in portions of the ceramic substrate corresponding to the position of the protruding end portions of the piezoelectric/electrostrictive film and an interface between the ceramic substrate and the lower electrode film.

5. The piezoelectric/electrostrictive film device according to claim 1, wherein the piezoelectric/electrostrictive composition is represented by the following formula (1), and the ceramic substrate is fired integrally with the piezoelectric/electrostrictive operating portion:

$$(Na_{1-x-y-z}K_xLi_yAg_z)_a(Nb_{1-w}Ta_w)O_3 \quad (1);$$

wherein $0.1 \leq x \leq 0.9$, $0 \leq y \leq 0.2$, $0 \leq z \leq 0.05$, $0 \leq w \leq 0.5$, and $0.95 \leq a \leq 1.05$.

6. The piezoelectric/electrostrictive film device according to claim 1, wherein the piezoelectric/electrostrictive composition is represented by the following formula (2), and the ceramic substrate is fired integrally with the piezoelectric/electrostrictive operating portion:

$$(Ag_{1-x}Li_x)_a(Nb_{1-y}Ta_y)O_3 \quad (2);$$

wherein $0.075 \leq x \leq 0.4$, $0 \leq y \leq 0.2$, and $0.95 \leq a \leq 1.05$.

7. The piezoelectric/electrostrictive film device according to claim 1, wherein the piezoelectric/electrostrictive composition is represented by the following formula (3), and the ceramic substrate is fired integrally with the piezoelectric/electrostrictive operating portion:

$$\{Li_x(K_{1-y}Na_y)_{1-x}\}_a(Nb_{1-z-w}Ta_zSb_w)O_3 \quad (3);$$

wherein $0 \leq x \leq 0.2$, $0 \leq y \leq 1$, $0 \leq z \leq 0.4$, $0 \leq w \leq 0.2$, and $0.95 \leq a \leq 1.05$.

8. The piezoelectric/electrostrictive film device according to claim 1, wherein the ceramic substrate comprises at least one of the alkali metal element and the metal element of the piezoelectric/electrostrictive composition.

9. The piezoelectric/electrostrictive film device according to claim 8, wherein the at least one of the alkali metal element and the metal element of the piezoelectric/electrostrictive composition is present in the ceramic substrate as an oxide thereof.

10. The piezoelectric/electrostrictive film device according to claim 9, wherein a concentration of each of the at least one of the oxide of the alkali metal element and the oxide of the metal element of the piezoelectric/electrostrictive composition that is present in the ceramic substrate radially and gradually decreases along a thickness direction of the ceramic substrate from a central portion of an interface between the ceramic substrate and the lower electrode film.

11. The piezoelectric/electrostrictive film device according to claim 10, wherein when the concentration of each of the at least one of the oxide of the alkali metal element and the oxide of the metal element of the piezoelectric/electrostrictive composition that is present in the ceramic substrate in the vicinity of the central portion of the interface is X, a portion of the ceramic substrate where the concentration of each of the at least one of the oxide of the alkali metal element and the oxide of the metal element of the piezoelectric/electrostrictive composition that is present in the ceramic substrate is 0.3X corresponds to a portion of the ceramic substrate that is spaced a distance from the central portion of the interface between the ceramic substrate and the lower electrode that is 10 to 90% of a thickness of the ceramic substrate.

12. The piezoelectric/electrostrictive film device according to claim 9, wherein the at least one of the oxide of the alkali metal element and the oxide of the metal element of the piezoelectric/electrostrictive composition is present in ceramic particles of the ceramic substrate.

13. The piezoelectric/electrostrictive film device according to claim 1, wherein the piezoelectric/electrostrictive film has such a size that the piezoelectric/electrostrictive film covers the lower electrode film and end portions of the piezoelectric/electrostrictive film protrude to extend onto the ceramic substrate; and wherein an incomplete bond is provided between the protruding end portions of the piezoelectric/electrostrictive film that extend onto the ceramic substrate and portions of the ceramic substrate corresponding to the positions of the protruding end portions of the piezoelectric/electrostrictive film.

14. The piezoelectric/electrostrictive film device according to claim 13, wherein a concentration of each of the alkali metal element and the metal element is higher in portions of the ceramic substrate corresponding to the positions of the protruding end portions of the piezoelectric/electrostrictive film than in a vicinity of an interface between the ceramic substrate and the lower electrode film.

15. The piezoelectric/electrostrictive film device according to claim 13, wherein the ceramic substrate comprises alumina ($Al_2O_3$), and wherein a reaction product of the alkali metal element of the piezoelectric/electrostrictive composition and the alumina ($Al_2O_3$) of the ceramic substrate is unevenly distributed as a layer in portions of the ceramic substrate corresponding to the position of the protruding end portions of the piezoelectric/electrostrictive film and an interface between the ceramic substrate and the lower electrode film.

16. The piezoelectric/electrostrictive device according to claim 1, wherein circle equivalent diameters of 90% or more of the large number of crystal particles of the piezoelectric/electrostrictive film are in a range of 0.3 to 50 μm.

17. A piezoelectric/electrostrictive device comprising:
a thin ceramic substrate; and
a piezoelectric/electrostrictive operating portion disposed on the ceramic substrate and comprising a lower electrode film, a piezoelectric/electrostrictive film including a large number of crystal particles having a piezoelectric/electrostrictive composition, and an upper electrode film successively laminated on the ceramic substrate;
wherein the piezoelectric/electrostrictive composition comprises one or more alkali metal elements selected from the group consisting of lithium (Li), potassium (K), and sodium (Na), and at least niobium (Nb) from among one or more metal elements selected from the group consisting of niobium (Nb), tantalum (Ta), antimony (Sb) and silver (Ag); and
wherein the substrate contains at least one of the alkali metal elements of the piezoelectric/electrostrictive composition, and at least one of niobium (Nb) and tantalum (Ta) of the piezoelectric/electrostrictive composition.

18. A piezoelectric/electrostrictive film device according to claim 17, wherein the substrate contains at least two of the alkali metal elements of the piezoelectric/electrostrictive composition.

19. The piezoelectric/electrostrictive film device according to claim 17, wherein the piezoelectric/electrostrictive composition is represented by the following formula (1), and the ceramic substrate is fired integrally with the piezoelectric/electrostrictive operating portion:

$$(Na_{1-x-y-z}K_xLi_yAg_z)_a(Nb_{1-w}Ta_w)O_3 \quad (1);$$

wherein $0.1 \leq x \leq 0.9$, $0 \leq y \leq 0.2$, $0 \leq z \leq 0.05$, $0 \leq w \leq 0.5$, and $0.95 \leq a \leq 1.05$.

20. The piezoelectric/electrostrictive film device according to claim 17, wherein the piezoelectric/electrostrictive composition is represented by the following formula (2), and the ceramic substrate is fired integrally with the piezoelectric/electrostrictive operating portion:

$$(Ag_{1-x}Li_x)_a(Nb_{1-y}Ta_y)O_3 \quad (2);$$

wherein $0.075 \leq x \leq 0.4$, $0 \leq y \leq 0.2$, and $0.95 \leq a \leq 1.05$.

21. The piezoelectric/electrostrictive film device according to claim 17, wherein the piezoelectric/electrostrictive composition is represented by the following formula (3), and the ceramic substrate is fired integrally with the piezoelectric/electrostrictive operating portion:

$$\{Li_x(K_{1-y}Na_y)_{1-x}\}_a(Nb_{1-z-w}Ta_zSb_w)O_3 \quad (3);$$

wherein $0 \leq x \leq 0.2$, $0 \leq y \leq 1$, $0 \leq z \leq 0.4$, $0 \leq w \leq 0.2$, and $0.95 \leq a \leq 1.05$.

22. The piezoelectric/electrostrictive film device according to claim 17, wherein the ceramic substrate comprises at least one of the alkali metal element and the metal element of the piezoelectric/electrostrictive composition.

23. The piezoelectric/electrostrictive film device according to claim 22, wherein the at least one of the alkali metal element and the metal element of the piezoelectric/electrostrictive composition is present in the ceramic substrate as an oxide thereof.

24. The piezoelectric/electrostrictive film device according to claim 23, wherein a concentration of each of the at least one of the oxide of the alkali metal element and the oxide of the metal element of the piezoelectric/electrostrictive composition that is present in the ceramic substrate radially and gradually decreases along a thickness direction of the ceramic substrate from a central portion of an interface between the ceramic substrate and the lower electrode film.

25. The piezoelectric/electrostrictive film device according to claim 24, wherein when the concentration of each of the at least one of the oxide of the alkali metal element and the oxide of the metal element of the piezoelectric/electrostrictive composition that is present in the ceramic substrate in the vicinity of the central portion of the interface is X, a portion of the ceramic substrate where the concentration of each of the at least one of the oxide of the alkali metal element and the oxide of the metal element of the piezoelectric/electrostrictive composition that is present in the ceramic substrate is 0.3X corresponds to a portion of the ceramic substrate that is spaced a distance from the central portion of the interface between the ceramic substrate and the lower electrode that is 10 to 90% of a thickness of the ceramic substrate.

26. The piezoelectric/electrostrictive film device according to claim 23, wherein the at least one of the oxide of the alkali metal element and the oxide of the metal element of the piezoelectric/electrostrictive composition is present in ceramic particles of the ceramic substrate.

27. The piezoelectric/electrostrictive film device according to claim 17, wherein the piezoelectric/electrostrictive film has such a size that the piezoelectric/electrostrictive film covers the lower electrode film and end portions of the piezoelectric/electrostrictive film protrude to extend onto the ceramic substrate; and
wherein an incomplete bond is provided between the protruding end portions of the piezoelectric/electrostrictive film that extend onto the ceramic substrate and portions of the ceramic substrate corresponding to the positions of the protruding end portions of the piezoelectric/electrostrictive film.

28. The piezoelectric/electrostrictive film device according to claim 27, wherein a concentration of each of the alkali metal element and the metal element is higher in portions of the ceramic substrate corresponding to the positions of the protruding end portions of the piezoelectric/electrostrictive film than in a vicinity of an interface between the ceramic substrate and the lower electrode film.

29. The piezoelectric/electrostrictive film device according to claim 28, wherein the ceramic substrate comprises alumina ($Al_2O_3$), and wherein a reaction product of the alkali metal element of the piezoelectric/electrostrictive composition and the alumina ($Al_2O_3$) of the ceramic substrate is unevenly distributed as a layer in portions of the ceramic substrate corresponding to the position of the protruding end portions of the piezoelectric/electrostrictive film and an interface between the ceramic substrate and the lower electrode film.

30. The piezoelectric/electrostrictive device according to claim 17, wherein circle equivalent diameters of 90% or more of the large number of crystal particles of the piezoelectric/electrostrictive film are in a range of 0.3 to 50 μm.

* * * * *